United States Patent
Vannorsdel et al.

(10) Patent No.: US 9,473,023 B2
(45) Date of Patent: Oct. 18, 2016

(54) SWITCHED MODE ASSISTED LINEAR REGULATOR WITH SEAMLESS TRANSITION BETWEEN POWER TRACKING CONFIGURATIONS

(71) Applicant: Texas Instruments Incorporated, Dallas, TX (US)

(72) Inventors: Kevin Vannorsdel, Erie, CO (US); Mark D. Kuhns, Peoria, AZ (US); Juha T. Pennanen, Oulu (FI)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 91 days.

(21) Appl. No.: 14/585,851

(22) Filed: Dec. 30, 2014

(65) Prior Publication Data

US 2015/0188432 A1     Jul. 2, 2015

Related U.S. Application Data

(63) Continuation-in-part of application No. 13/963,355, filed on Aug. 9, 2013, now Pat. No. 9,112,413.

(60) Provisional application No. 61/681,901, filed on Aug. 10, 2012.

(51) Int. Cl.
*H02M 3/158* (2006.01)
*H02M 3/156* (2006.01)
(Continued)

(52) U.S. Cl.
CPC ........... *H02M 3/156* (2013.01); *H03F 1/0227* (2013.01); *H03F 3/2173* (2013.01); *H02M 1/15* (2013.01);
(Continued)

(58) Field of Classification Search
CPC . H02M 3/156; H02M 3/1588; H03F 1/0227; H03F 3/2173
See application file for complete search history.

(56) References Cited

U.S. PATENT DOCUMENTS 5,477,481 A    12/1995  Kerth
6,229,289 B1   5/2001   Piovaccari et al.
(Continued)

FOREIGN PATENT DOCUMENTS

CN    1136370 A      11/1996
CN    100559319 C    11/2009

OTHER PUBLICATIONS

Search Report, dated Dec. 4, 2015.
(Continued)

*Primary Examiner* — Jue Zhang
(74) *Attorney, Agent, or Firm* — Andrew Viger; Frank D. Cimino

(57) ABSTRACT

A Switch Node Assisted Linear architecture, including a linear amplifier in parallel with a switched converter, is configurable in two tracking modes: (a) a SMAL regulator in which the amplifier sets load voltage with an envelope tracking bandwidth, and the switched converter is configured for current assist, and (b) a Switched Mode Power Supply configuration in which the amplifier is switch-decoupled, and the switcher circuit is switched configured with an output capacitor, operable as an SMPS providing load voltage with an adaptive tracking bandwidth that is less than the envelope tracking bandwidth. Staged switching effects substantially seamless transitions between tracking modes, with the amplifier holding the load voltage at a substantially constant envelope tracking voltage (CVET): (a) for ET-AT transitions, the CVET mode enables precharging the output capacitor to a target AT voltage, prior to switch-decoupling the amplifier; and (b) for AT-ET transitions, CVET mode enables discharging the output capacitor.

20 Claims, 13 Drawing Sheets

(51) Int. Cl.
*H03F 1/02* (2006.01)
*H03F 3/217* (2006.01)
*H02M 1/00* (2006.01)
*H02M 1/15* (2006.01)

(52) U.S. Cl.
CPC ... *H02M 3/1588* (2013.01); *H02M 2001/0025* (2013.01); *H02M 2001/0045* (2013.01); *H03F 2200/432* (2013.01); *Y02B 70/1466* (2013.01)

(56) References Cited

U.S. PATENT DOCUMENTS

| | | | |
|---|---|---|---|
| 6,452,368 B1 | 9/2002 | Basso et al. | |
| 6,813,173 B2 | 11/2004 | Lipcsei | |
| 7,084,612 B2 | 8/2006 | Zinn | |
| 7,190,150 B2 | 3/2007 | Chen et al. | |
| 7,495,423 B1 | 2/2009 | Knight et al. | |
| 7,653,366 B2 * | 1/2010 | Grigore | H03F 1/0227 323/268 |
| 7,679,433 B1 | 3/2010 | Li | |
| 7,872,883 B1 | 1/2011 | Elbanhawy | |
| 8,063,617 B2 | 11/2011 | Wang et al. | |
| 8,217,636 B2 | 7/2012 | Khayat et al. | |
| 8,373,397 B2 | 2/2013 | Tanifuji et al. | |
| 8,665,018 B2 | 3/2014 | Strange et al. | |
| 8,723,500 B2 | 5/2014 | Houston et al. | |
| 8,803,605 B2 | 8/2014 | Fowers et al. | |
| 8,816,768 B2 | 8/2014 | Tseng et al. | |
| 8,897,724 B2 | 11/2014 | Hou | |
| 8,957,728 B2 | 2/2015 | Gorisse | |
| 9,112,409 B2 * | 8/2015 | Li | H03F 1/0227 |
| 9,112,413 B2 * | 8/2015 | Barth | H03F 1/0227 |
| 9,256,234 B2 * | 2/2016 | Kay | H03F 1/0227 |
| 9,276,475 B2 * | 3/2016 | Barth | H03F 1/0227 |
| 9,280,163 B2 * | 3/2016 | Kay | H03F 1/0227 |
| 2005/0275392 A1 | 12/2005 | Wong et al. | |
| 2006/0043946 A1 | 3/2006 | Rose | |
| 2006/0132112 A1 | 6/2006 | Oswald et al. | |
| 2007/0165427 A1 | 7/2007 | McDonald et al. | |
| 2008/0054860 A1 | 3/2008 | Angell | |
| 2008/0088284 A1 | 4/2008 | Weng | |
| 2008/0157895 A1 | 7/2008 | Immonen et al. | |
| 2009/0102448 A1 | 4/2009 | Wang et al. | |
| 2009/0278516 A1 | 11/2009 | Ghagwat et al. | |
| 2011/0300816 A1 | 12/2011 | Collados et al. | |
| 2013/0214858 A1 | 8/2013 | Tournatory et al. | |
| 2014/0125299 A1 | 5/2014 | Barth et al. | |

OTHER PUBLICATIONS

Chinese Office Action.
PCT/US13/54481 Search Report, mailed Nov. 27, 2013.

* cited by examiner

SWITCHED MODE ASSISTED LINEAR REGULATOR WITH SEAMLESS TRANSITION BETWEEN POWER TRACKING CONFIGURATIONS

CROSS-REFERENCE TO RELATED APPLICATIONS

This application is a continuation-in-part of U.S. application Ser. No. 13/963,355, filed Aug. 9, 2013, which claims priority to U.S. Provisional Application No. 61/681,901, filed Aug. 10, 2012.

BACKGROUND

1. Technical Field

This Patent Document relates generally to hybrid or composite amplifier/regulator architectures that combine a switched mode converter and a linear amplifier, also referred to as linear assisted switched mode or a switched mode assisted linear architectures.

2. Related Art

A hybrid regulator includes a switched mode converter (or switched converter) and a linear amplifier coupled in parallel at a power output node, and cooperatively controlled to supply regulated load voltage. In such hybrid regulators, the higher bandwidth but less efficient linear amplifier supplies the higher frequency content of the output power, while the more efficient but lower bandwidth switched converter provides the lower frequency content.

One application for a hybrid regulator is as an envelope modulated power supply for an RF (radio frequency) power amplifier (PA). Envelope modulation/tracking improves power amplification efficiency for high peak-to-average power ratio (PAR) signals such as typical of mobile RF communications—envelope modulated regulators dynamically control the RF PA supply voltage, tracking PA output power variations/requirements.

Design parameters for an envelope modulated/tracking power supply include noise, distortion and bandwidth. Noise and distortion generated by the envelope modulator and injected into the PA supply pin will transfer to the PA output spectrum. For hybrid regulator architectures, a significant noise source is switching noise from the switched mode converter, and an important design criteria is to reduce small signal output impedance of the linear amplifier over the operational bandwidth of the envelope modulator (the output impedance bandwidth).

Hybrid regulators can be configured with the linear amplifier AC coupled to the power output node, such that the linear amplifier is only required to supply AC content of the bad voltage. DC average voltage at the output of the regulator is maintained on the AC coupling (DC-decoupling) capacitor.

While this Background information is presented in the context of regulated power supplies for power amplifier applications, this Patent Document is not limited to such applications, but is more generally directed to hybrid architectures that include a switched mode converter and a linear amplifier.

BRIEF SUMMARY

This Brief Summary is provided as a general introduction to the Disclosure provided by the Detailed Description and Figures, summarizing various aspects and features of the switch mode assisted linear regulator with seamless transition between power tracking modes.

The Disclosure describes apparatus and methods for adapting a switched mode assisted linear (SMAL) amplifier architecture as a regulator supplying a regulated dynamic load voltage (and associated load current) to a dynamic load characterized by a signal bandwidth. The SMAL regulator architecture includes a linear amplifier coupled in parallel to a switched mode converter (switched converter or switcher) at a supply node coupled to the load. The SMAL regulator is configured for, and characterized by, a tracking (signal path) bandwidth, related generally as a design-consideration to the signal bandwidth of the dynamic load.

In aspects of the Disclosure, the SMAL regulator architecture is adaptable as a power supply operable in two tracking configurations/modes with tracking bandwidths related to the load power bandwidth, including selectively configuring the power supply for operation in two tracking modes during respective frames: (a) an envelope tracking (ET) mode configuration during an ET frame in which the amplifier circuit and the switcher circuit are switch-configured as a switch mode assisted linear (SMAL) regulator, with the amplifier circuit switch-coupled to the supply node, and operable to set the regulated load voltage with an envelope tracking bandwidth, and to supply load current not supplied by the switcher circuit, and in which the switcher circuit is operated as a controlled current source supplying switcher current at a switcher bandwidth less than the envelope tracking bandwidth; and (b) an adaptive tracking (AT) mode configuration during an AT frame in which the amplifier circuit is switch-decoupled from the supply node, and the switcher circuit and the output capacitor are switch-configured as a switched mode power supply (SMPS) operable to set the regulated load voltage at the supply node, and supply the load current, with an adaptive tracking bandwidth that is less than the envelope tracking bandwidth.

The power supply is selectively configured by controlling transitions between the tracking mode configurations using staged switching to effect two transition modes in which the amplifier circuit is operated in constant voltage envelope tracking (CVET) mode such that the regulated load voltage at the supply node is held at a substantially constant CVET voltage: (a) an ET-AT transition mode initiated at an AT frame boundary by switch-coupling the bottom plate of the output capacitor to ground, and operating the amplifier circuit in CVET mode to hold the supply node at a CVET voltage corresponding to a target AT voltage, enabling the output capacitor to pre-charge to the target AT voltage, and then switch-decoupling the amplifier circuit from the supply node, thereby transitioning to the SMPS configuration operating in AT tracking mode; and (b) an AT-ET transition mode initiated prior to an ET frame boundary, by switch-coupling the linear amplifier to the supply node, and operating the amplifier circuit in CVET mode to hold the supply node at a CVET voltage corresponding to an APT voltage on the output capacitor, and then switch-decoupling the bottom plate of the output capacitor from ground, enabling the output capacitor to discharge, thereby transitioning to the SMAL regulator configuration operating in ET tracking mode.

According to other aspects and features of the invention: (a) selectively configuring the power supply by controlling transitions between the tracking mode configurations using staged switching is accomplished with staged switch array circuitry, including a first transistor mode switch coupled between a bottom plate of the output capacitor and ground, and a second transistor mode switch coupled between the amplifier circuit and the supply node; (b) in the SMAL configuration operating in ET mode, the envelope tracking bandwidth is substantially equal to the power bandwidth of the load; (c) in the SMPS configuration operating in AT mode, the adaptive tracking mode tracks average peak power; (d) in the SMAL regulator configuration, the switcher circuit is configured to maximize switcher current at the switcher bandwidth, thereby minimizing amplifier current required to be supplied by the amplifier circuit; (e) the switcher circuit is configured as a buck converter with a buck inductor; and (f) the dynamic load is an RF transmit power amplifier configured to amplify a dynamic RF signal with an RF bandwidth, and the power amplifier outputs an amplified RF signal with an RF power bandwidth.

Other aspects and features of the claimed invention will be apparent to those skilled in the art from the following Disclosure.

DETAILED DESCRIPTION

This Description and the Figures constitute a Disclosure of example embodiments and applications that illustrate various features and advantages of a switch mode assisted linear (SMAL) regulator configurable to supply to a dynamic load characterized by a signal bandwidth, a regulated load voltage with configurable tracking bandwidth relative to the load signal bandwidth. The SMAL regulator architecture includes a linear amplifier (LA) coupled in parallel with a switched mode converter (switched converter or switcher) at a supply node that is coupled to the load.

Example embodiments of the SMAL regulator are described in the context of an example application as a power supply for an RF power amplifier (PA) characterized by a power bandwidth corresponding to the RF signal bandwidth.

For example, in some example embodiments, the SMAL regulator can be configured so that linear amplifier sets the regulated load voltage and tracking bandwidth, with the switched converter configured and operated as a controlled current source supplying switcher current at a switcher bandwidth that is less than the tracking bandwidth (i.e., supplying lower frequency load current, while the higher bandwidth LA supplies load current not supplied by the switcher).

Figure 9A:
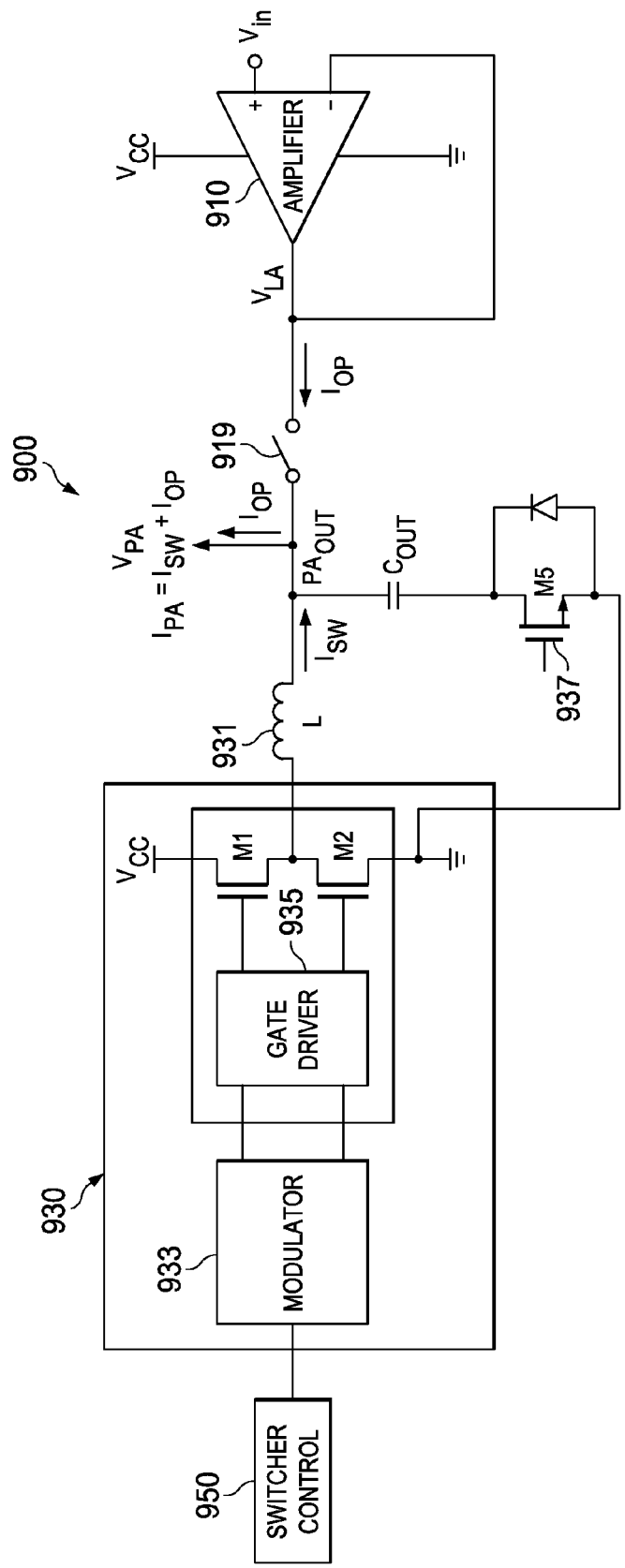
FIGS. 9A, 9B, 9C illustrates an example embodiment of a SMAL regulator with DC-coupled linear amplifier as in FIG. 2, configured for substantially seamless transitioning between two configuration/tracking modes, accomplished using a CVET (constant voltage envelope tracking) transition mode and a CVET-controlled staged switch array: (9A and 9B) a relatively higher bandwidth (higher power) envelope tracking/modulation (ET) mode, including a linear amplifier assisted by a switched converter configured as a current source, and (9A and 9C) a relatively lower bandwidth (lower power) adaptive power tracking (APT) mode in which the SMAL regulator is reconfigured as a switched mode power supply by switch-connecting an output filter capacitor $C_{OUT}$, and switch-disconnecting the linear amplifier, while minimizing perturbations in the $PA_{OUT}$ supply voltage.

In some example embodiments, described in connection with FIGS. 9A-9F, the SMAL regulator is configured for substantially seamless transitioning between two configuration/tracking modes, accomplished using a CVET (constant voltage envelope tracking) transition mode and a CVET-controlled staged switch array: FIGS. 9A/9B illustrate a relatively higher bandwidth (higher power) envelope tracking/modulation (ET) mode, including a linear amplifier assisted by a switched converter configured as a current source; and FIGS. 9A/9C illustrate a relatively lower bandwidth (lower power) adaptive power tracking (APT) mode in which the SMAL regulator is reconfigured as a switched mode power supply by switch-connecting an output filter capacitor $C_{OUT}$, and switch-disconnecting the linear amplifier, while minimizing perturbations in the $PA_{OUT}$ supply voltage.

Envelope Modulation.

An example application of a SMAL regulator according to the invention is supply envelope modulation for an RF PA. In an RF transmitter using supply envelope modulation, the supply voltage provided to the RF PA is dynamically modulated to correspondingly track output power variation required by the PA. Envelope modulation provides significant efficiency improvement for high peak-to-average power ratio (PAR) signals typical of RF communications (such as used in mobile handsets and base stations).

Figure 1A:
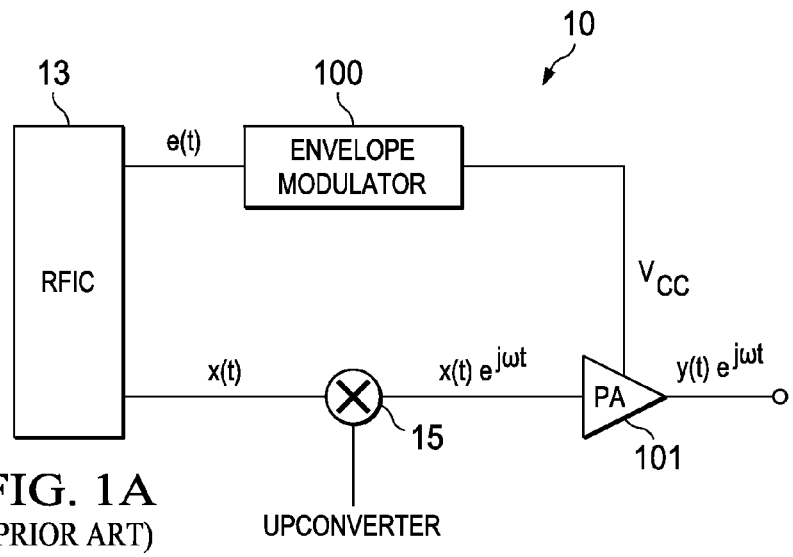
FIGS. 1A and 1B illustrate an example RF transmitter system including a power amplifier (PA), and including an envelope modulator configured to supply envelope modulated power to the PA that tracks power variations/requirements of the PA.

FIG. 1A is a functional illustration of an example RF transmitter system 10 including an RF power amplifier 11 and an RF baseband subsystem 13 commonly referred to as an RFIC (RF integrated circuit). RFIC 13 generates a baseband signal x(t), which is up-converted 15 to RF, and then amplified by the PA (such as for driving an RF antenna).

Envelope modulator 100 supplies power to the PA (the PA supply rail), modulating supply voltage in response to an envelope signal e(t) from RFIC 13. The envelope tracking signal e(t) tracks output power variations/requirements of the PA as determined by RFIC 13. That is, RFIC 13 splits the baseband signal between two separate paths: an envelope tracking signal e(t) that carries envelope (magnitude) information, and a constant magnitude signal x(t), that carries phase information:

$$e(t)=|s(t)| \quad (1)$$

$$x(t)=s(t)/|s(t)| \quad (2)$$

These two signals are merged by the PA. Because the operation in (1) is nonlinear, even though s(t) is bandwidth limited, the envelope signal e(t) will not be, and as a result, the envelope modulation bandwidth typically will be significantly larger than the signal path bandwidth.

Figure 1B:
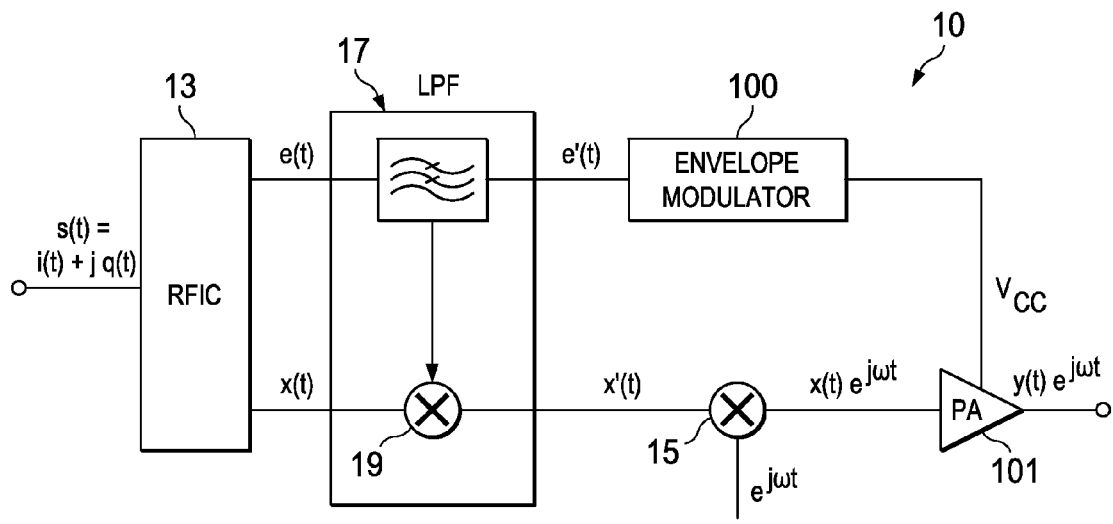

FIG. 1B illustrates an alternate embodiment of the RF transmitter system 10 that includes a low pass filter 17 after RFIC 13. The low pass filter can be configured to reduce the bandwidth of the envelope signal e(t) input to envelope modulator 100. Symbol adjustment 19 prior to up-conversion/mixing 15 can be used to compensate for latency introduced by the low pass filter.

This alternate embodiment represents design trade-offs in terms of overall efficiency of the RF transmitter system 10, including the envelope modulator 100. For example, reducing the bandwidth of envelope modulator 100 (that is, reducing the bandwidth of the envelope tracking signal e(t) input to the envelope modulator) sacrifices some PA efficiency in that the tracking bandwidth of the PA supply voltage is reduced, but is advantageous in terms of improved envelope modulator efficiency. Including symbol adjustment in the x(t) signal path will increase signal path bandwidth, and therefore will increase the bandwidth requirement of the upconverter/mixer and the input to the PA.

Other advantages of limiting envelope tracking bandwidth include reduced receive band noise, and reduced PA gain error. RX band noise is noise measured at the output of the PA within the receive band of the RF transceiver—by reducing the envelope tracking bandwidth, the envelope modulator will introduce less noise and/or distortion, reducing RX band noise, PA gain error is proportional to the difference between the envelope tracking signal through the envelope modulator and the actual envelope tracking signal—if envelope tracking bandwidth is reduced, PA gain error is reduced, reducing RX band noise.

SMAL Regulator—DC Coupled.

Figure 2:
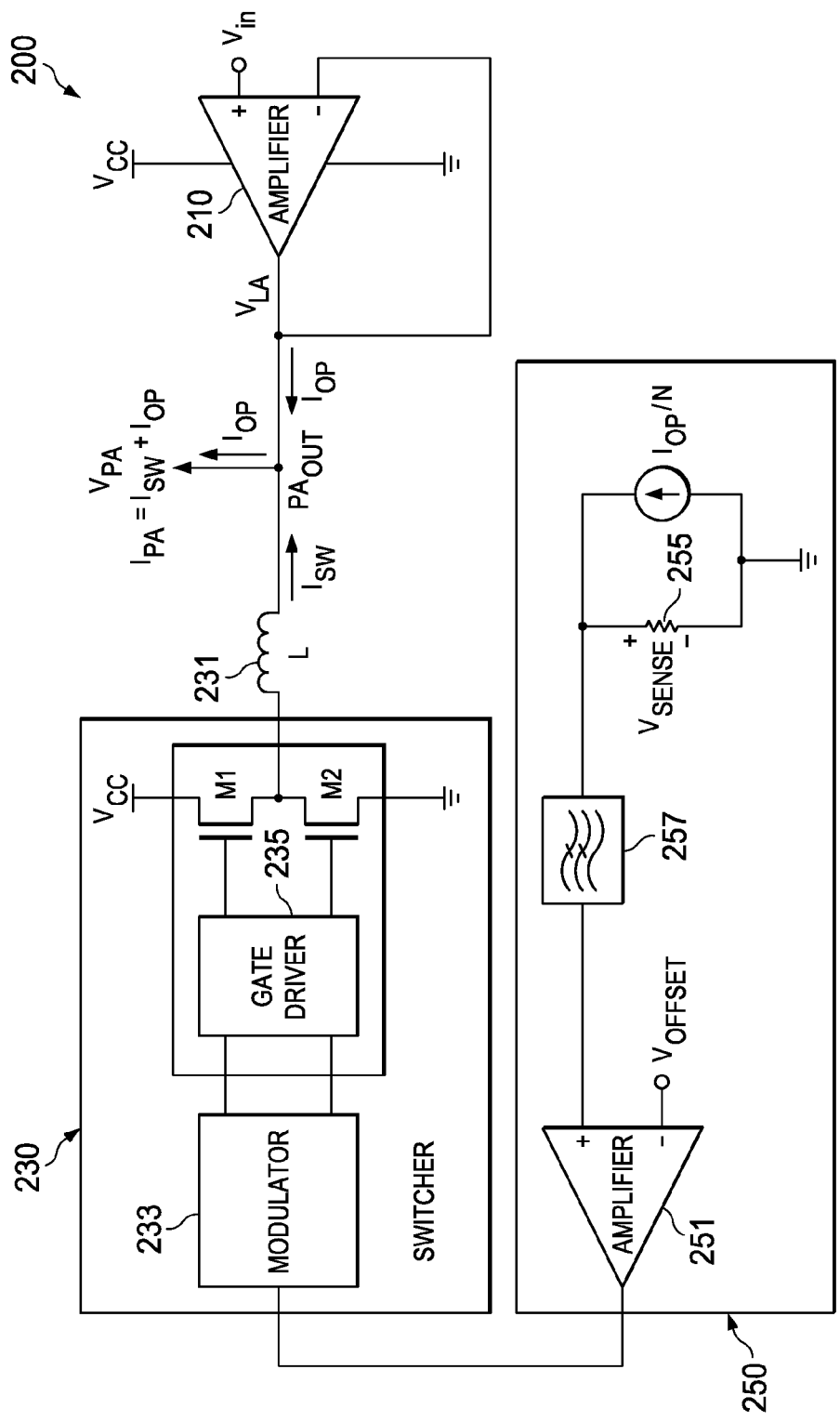
FIG. 2 illustrates an example embodiment of a SMAL (switched mode assisted linear) regulator configured as an envelope modulator/supply for an RF PA, including a switched mode converter configured to supply load current, and a DC coupled linear amplifier configured to supply regulated load voltage, and load current not supplied by the switched converter.

FIG. 2 illustrates an example embodiment of a SMAL regulator 200 configured to provide regulated power to a load—load voltage $V_{PA}$ and load current $I_{PA}$. SMAL regulator 200 includes a linear amplifier 210 and a switched mode converter 230, with an associated switching controller 250, configured as a current supply. Linear amplifier 210 and switched mode converter 230 are parallel coupled at a supply (current summing) output node $PA_{OUT}$ (coupled to the supply pin of a power amplifier).

For this example embodiment, the linear amplifier is DC coupled to the supply output $PA_{OUT}$ node.

The linear amplifier stage 210 supplies a dynamic load voltage $V_{PA}$ in response to a dynamic input voltage $V_{IN}$. For the example application for use in an RF transmitter system, SMAL regulator 200 is configured as an envelope modulated supply for an RF PA (FIG. 1A), such that the dynamic input voltage $V_{IN}$ is an envelope tracking signal (from an RFIC) and the SMAL regulator supplies dynamic regulated load voltage $V_{PA}$, and the required load current $I_{PA}$, to the PA, Linear amplifier 210 is configured to provide voltage regulation, setting the dynamic load voltage $V_{PA}$ supplied to the PA. Linear amplifier also supplies the required load current $I_{OP}$ not supplied by switched converter 230. SMAL regulator 200 can be configured to maximize the $I_{SW}$ load current from switched converter 230 (current supply), thereby minimizing the $I_{OP}$ load current required to be supplied by linear amplifier 210. In this configuration, a lower bandwidth switched converter supplies lower frequency $I_{SW}$ load current, and a higher bandwidth linear amplifier supplies higher frequency $I_{OP}$ load current, such that $I_{SW}+I_{OP}$ at the $PA_{OUT}$ node supplies the $I_{PA}$ load current required by the PA.

An example embodiment of linear amplifier 210 is described below (FIGS. 7A and 7B), including configuring the linear amplifier to establish the signal path bandwidth for SMAL regulator 200, and including decoupling the configuration of signal path bandwidth from the configuration of output impedance bandwidth. Decoupling output impedance bandwidth from signal path bandwidth enables the output impedance bandwidth to be maximized relatively independent of signal path bandwidth, an important advantage because, in addition to supplying higher frequency load current ($I_{OP}$), linear amplifier 210 can be configured to reject switching noise and ripple generated by switched converter 230.

The example embodiment of switched converter 230 is implemented as a buck converter configured as a current supply/source. Switched converter 230 includes a buck inductor 231, but does not include the output capacitor of a conventional buck voltage regulator. In effect, linear amplifier 210 replaces the conventional buck output capacitor. This example converter topology is a design choice, and alternative implementations of the switched converter include boost, buck-boost and flyback.

According to conventional buck converter design, a controlled modulator circuit 233 controls gate drivers 235 for buck switches (FETs) M1/M2. A switching controller 250 is configured to control the switching duty cycle of the switched converter 230.

Switching controller 250 is implemented with a hysteretic voltage comparator 251. One input to comparator 251 is derived from the $I_{OP}$ load current supplied by the linear amplifier 210, and the other input is a design-specified offset $V_{OFFSET}$. As illustrated, $I_{OP}/N$ from the linear amplifier is converted to a voltage by a resistor 255, and low pass filtered 257 to reduce switching frequency. For the example embodiment, $I_{OP}/N$ is provided by one of the N output transistors of linear amplifier 210, so that the $I_{OP}$ load current supplied by the linear amplifier is provided by N-1 of the N output transistors.

Switching controller 250 can be configured to optimize efficiency of SMAL regulator 200 in supplying power to the PA, which typically results from maximizing the $I_{SW}$ component of the $I_{PA}$ load current supplied by switched converter 230 (subject to bandwidth limitations), and correspondingly minimizing the $I_{OP}$ load current required to be supplied by the linear amplifier 210 (and therefore power dissipation in the linear amplifier). That is, the $I_{SW}$ current sourced/sunk by switched converter 230 is maximized, and the $I_{OP}$ current required to be sourced/sunk by linear amplifier 210 is minimized, such that the higher speed but less efficient linear amplifier delivers the higher frequency $I_{OP}$ content of the dynamic $I_{PA}$ load current, while the more efficient but lower bandwidth switched converter provides the lower frequency $I_{SW}$ content. For example, efficiency optimization typically results from setting the $V_{OFFSET}$ input to comparator 251 to zero.

For the example buck implementation of switched converter 230, bandwidth is limited primarily by the maximum current slew rate through the buck inductor 231 (with inductance L) given by Rising Slew Rate=$(V_{CC}-V_{PA})/L$ Falling Slew Rate=$V_{PA}/L$ linear amplifier 210 then dynamically sources/sinks the difference between the required $I_{PA}$ load current and the $I_{SW}$ load current supplied by switched converter 230. The inductance L provided by the buck inductor is a design-specified parametric component selection based on design trade-offs.

Figure 3:
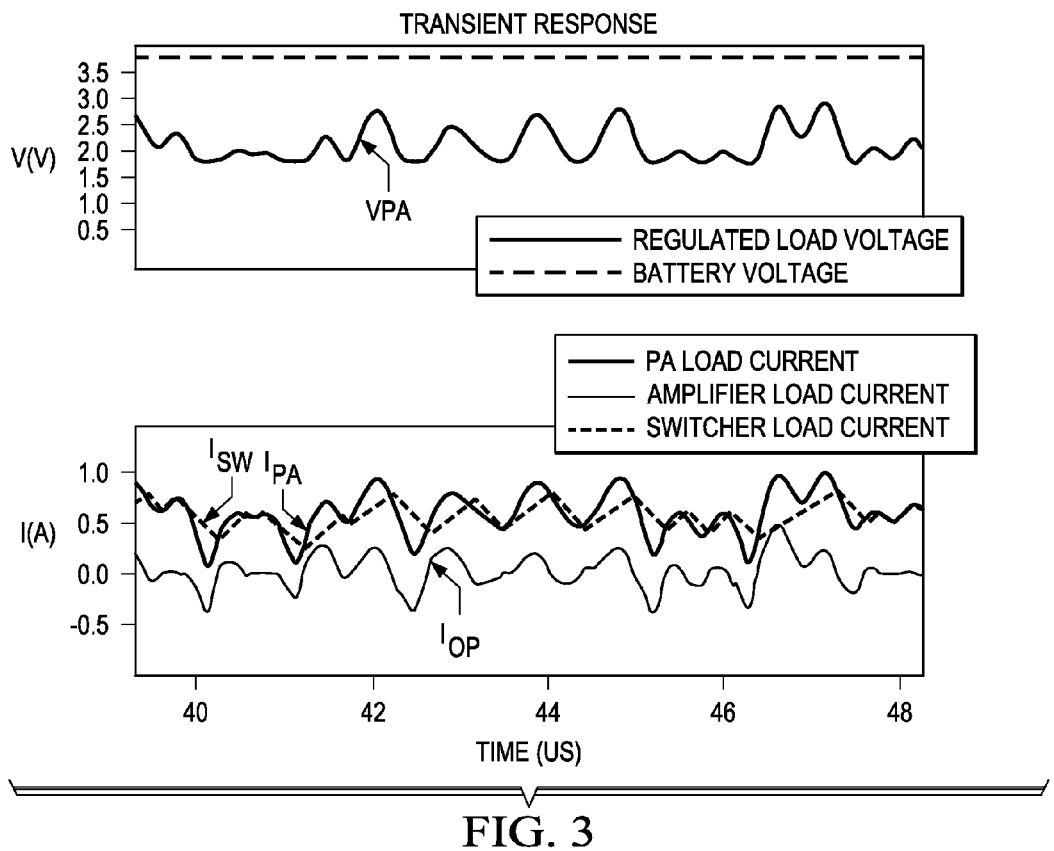
FIG. 3 illustrates, for the SMAL regulator embodiment illustrated in FIG. 2, example waveforms for: (a) in an upper plot, PA load/supply voltage $V_{PA}$ tracking PA output power variations/requirements, and (b) in the tower plot, associated PA load current $I_{PA}$, together with separate plots for $I_{SW}$ load current supplied by the switched mode converter, and additional $I_{OP}$ load current required to be supplied by the linear amplifier.

FIG. 3 illustrates, for SMAL regulator 200, example waveforms for: (a) in the upper plot, $V_{PA}$ load voltage tracking PA output power variations/requirements, as set by the linear amplifier, and (b) in the lower plot, associated $I_{PA}$ load current ($I_{SW}+I_{OP}$), together with separate plots for the lower frequency $I_{SW}$ load current supplied by the switched converter, and the higher frequency $I_{OP}$ load current required to be supplied by the linear amplifier. Note that, for the example embodiment, based on the dynamic requirements of the $I_{PA}$ load current and the bandwidth limitations of the switched converter, both the linear amplifier and the switched converter can source and sink current.

Referring to FIG. 2, as noted, SMAL regulator 200 and linear amplifier 210 can be configured with a signal path bandwidth that is significantly higher than the bandwidth of the switched converter 230. For example, an implementation of a SMAL regulator according to this Disclosure can be configured for a signal path bandwidth in the range of 20 MHz with a converter switching frequency in the range 1-15 MHz (depending on passive components and signal characteristics).

AC Coupling with Capacitive Charge Control.

Figure 4:
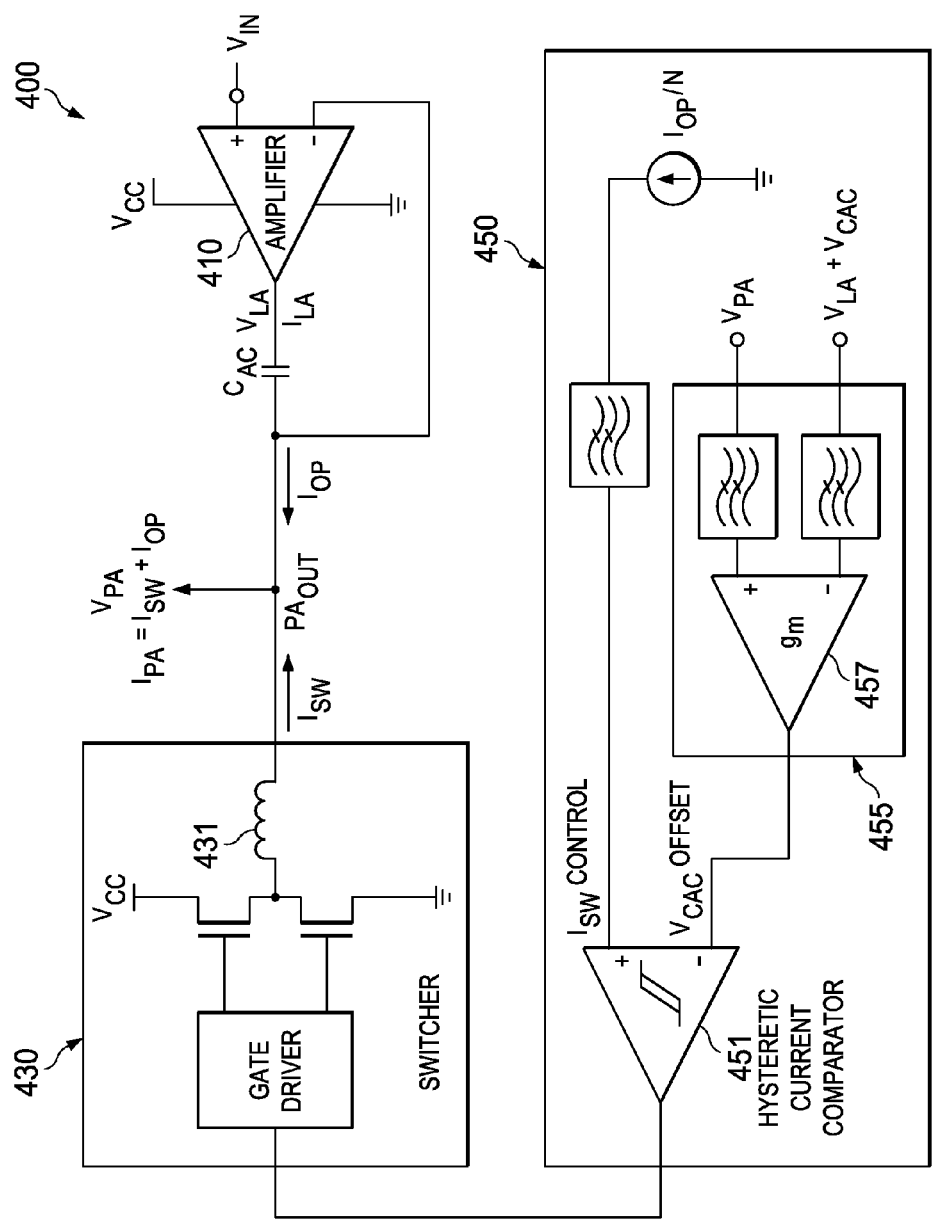
FIG. 4 illustrates an example embodiment of a SMAL regulator in which the linear amplifier is AC coupled ($PA_{OUT}$ supply node) to a switched mode converter configured as a current supply, and in which the switching (current) control loop is configured to effectively control the linear amplifier to provide capacitive charge control for the coupling capacitor.

FIGS. 4, 5 (A/B) and 6 illustrate embodiments of a SMAL regulator in which the linear amplifier is AC coupled to the $PA_{OUT}$ node through an AC coupling (DC decoupling) capacitor $C_{AC}$. For each embodiment, the coupling capacitor $C_{AC}$ is coupled between the linear amplifier output and the $PA_{OUT}$ node, within the external feedback loop of the linear amplifier.

With AC coupling, a design-specified DC-average voltage is maintained on the $C_{AC}$ coupling capacitor, and the linear amplifier supplies the AC content of the $V_{PA}$ load voltage supplied by the SMAL regulator ($PA_{OUT}$ supply node). The $I_{OP}$ load current supplied by the linear amplifier is coupled through the $C_{AC}$ coupling capacitor to the $PA_{OUT}$ node, so that, to maintain the design-specified DC-average voltage on $C_{AC}$, the steady-state average current through the $C_{AC}$ coupling capacitor is zero.

The SMAL regulator can be configured to control the average current input from the linear amplifier into the coupling capacitor $C_{AC}$ to maintain a design-specified DC-average voltage on $C_{AC}$: (a) example embodiments in FIGS. 4 and 5A/B illustrate a SMAL regulator in which the switched mode converter stage includes a capacitive charge control loop that controls the $I_{SW}$ load current to effectively control the output current of the linear amplifier, and (b) an alternate example embodiment in FIG. 6 illustrates a SMAL regulator in which the linear amplifier stage includes a charge control transistor with associated capacitive charge control, configured to control the current output from the linear amplifier into the coupling capacitor.

For the example embodiments, $C_{AC}$ capacitance can be relatively large (for example, in the range of 5-10 uF). In this configuration, the $C_{AC}$ coupling capacitor is not designed to filter switching noise/ripple from switched converter, but instead acts as a DC voltage level shifter, storing a design-specified DC-average of the $V_{PA}$ output voltage. The design-specified level of the DC-average voltage $V_{PA-DC}$ on the $C_{AC}$ coupling capacitor can be set from a register or by calculation from one or more registers.

FIG. 4 illustrates an example embodiment of a SMAL regulator 400 in which a linear amplifier 410 is AC coupled to the $PA_{OUT}$ node through an AC coupling capacitor $C_{AC}$. A switched mode converter 430 includes a switching controller 450 with nested control loops, including a $V_{CAC}$ control loop 455 configured to effect capacitive charge control.

Functionally, $V_{CAC}$ control loop 455 introduces a $V_{CAC}$ offset (corresponding design-specified DC-average voltage $V_{PA-DC}$ on the $C_{AC}$ coupling capacitor) to the into an $I_{SW}$ control loop ($I_{OP}/N$) that controls the $I_{SW}$ load current supplied by switched converter 430, with the. Responsive to the $V_{CAC}$ offset, switched converter 430 correspondingly adjusts the $I_{SW}$ load current such that the linear amplifier 410 adjusts its $I_{LA}$ output current to a non-zero average. As a result, the voltage on the $C_{AC}$ coupling capacitor changes based on the average current through the $C_{AC}$ coupling capacitor to the $PA_{OUT}$ node, charging/discharging the coupling capacitor $C_{AC}$ to maintain the DC-average voltage $V_{PA-DC}$.

A design consideration for the AC coupled embodiment of the SMAL regulator 400 is establishing the DC-average voltage $V_{PA\text{-}DC}$ relative to the supply voltage of linear amplifier 410. For purposes of illustration, ignoring the DC-average voltage $V_{PA\text{-}DC}$, SMAL regulator 400 can supply an output voltage above supply (for example, battery) voltage so long as the signal peak-to-peak amplitude is less than the supply voltage. For example, for a supply voltage of 2.5V and a signal peak-to-peak $V_{PP}$ of 1.6V, boosting the LA supply rail would not be required if the PA load voltage $V_{PA}$ swings from 2V to 3.6V because the signal $V_{PP}$ is below the 2.5V supply voltage (and will remain so as long as the supply voltage remains above 1.6V with appropriate headroom). That is, for the AC coupled example embodiment, the design constraints at the LA are that both $V_{PP}$, and $V_{PA\text{-}DC}$ (average $V_{PA}$ output voltage) must be less than the supply voltage by some headroom (in some embodiments, $V_{PA\text{-}DC}$ could be zero volts). Thus, AC coupling provides a degree of design freedom in specifying a maximum PA load voltage $V_{PA\text{-}PK}$ without requiring boosting the supply rail of the linear amplifier 410. Specifically, $V_{PA\text{-}PK}$ can be greater than the supply voltage as long as the $V_{PP}$ and $V_{PA\text{-}DC}$ constraints are observed. Contrast the example DC coupled implementation illustrated in FIG. 2 in which $V_{PA\text{-}PK}$ is constrained.

Switching controller 450 is configured to control the switched converter (buck) 430, both (a) for steady-state operation, to supply $I_{SW}$ load current that minimizes the $I_{OP}$ load current required to be supplied by linear amplifier 410, and (b) as necessary, to adjust $I_{SW}$ to cause the linear amplifier to output a non-zero-average $I_{LA}$ output current that, in addition to supplying the required $I_{OP}$ load current, charges/discharges the coupling capacitor $C_{AC}$ to maintain the DC-average voltage $V_{PA\text{-}DC}$ on the coupling capacitor $C_{AC}$.

Switching controller 450 includes a hysteretic current comparator 451 that defines an $I_{SW}/I_{OP}$ hysteretic window. Hysteretic current comparator 451 receives inputs derived from two (nested) control loops: (a) an $I_{SW}$ control loop based on $I_{OP}/N$ corresponding to the $I_{OP}$ load current supplied by linear amplifier 410, and (b) the $V_{CAC}$ control loop 455 based on the voltage across the coupling capacitor $C_{AC}$. Referring to FIG. 2, the $V_{CAC}$ control loop basically replaces the $V_{OFFSET}$ input to the hysteretic voltage comparator 251.

The $I_{SW}$ control loop operates to drive the buck switched converter to supply $I_{SW}$ load current to minimize the $I_{OP}$ load current from the linear amplifier by maintaining $I_{OP}/N$ (averaged by low pass filtering) within the $I_{SW}/I_{OP}$ hysteretic window. As a result, the linear amplifier outputs (steady-state) a zero-average output current $I_{LA}$, coupled through the coupling capacitor $C_{AC}$ to the $PA_{OUT}$ summing node as the $I_{OP}$ load current supplied by linear amplifier 410.

The $V_{CAC}$ control loop 455 is implemented with a transconductance (gm) amplifier 457. The $V_{CAC}$ control loop introduces a $V_{CAC}$ charge control offset into the $I_{SW}/I_{OP}$ hysteretic window, corresponding to the design-specified DC-average voltage $V_{PA\text{-}DC}$ (or $V_{CAC}$) on the coupling capacitor $C_{AC}$. Transconductance (gm) amplifier 457 provides a current input to the hysteretic comparator 451 proportional the voltage across the $C_{AC}$ coupling capacitor referenced to $V_{CAC}$: $gm*[V_{PA}-(V_{LA}+V_{CAC})]$. That is, the $V_{CAC}$ offset introduced by the $V_{CAC}$ control loop corresponds to the difference between (a) $V_{PA}$, the PA load voltage, and (b) $(V_{LA}+V_{CAC})$, the linear amplifier output voltage $V_{LA}$ plus the design-specified coupling capacitor offset $V_{CAC}$ (corresponding to the design-specified DC-average voltage $V_{PA\text{-}DC}$). Low pass filtering these inputs reduces the requirement for high frequency common mode rejection.

When the voltage on the $C_{AC}$ coupling capacitor deviates from the design-specified offset voltage $V_{CAC}$, the $I_{SW}/I_{OP}$ hysteretic window $(V_{PA}-(V_{LA}+V_{CAC}))$ is non-zero, so that the $I_{SW}$ control loop operates to drive switched converter 430 to output an $I_{SW}$ load current that causes the linear amplifier to correspondingly output a non-zero-average $I_{LA}$ current. This non-zero-average $I_{LA}$, in addition to providing the $I_{OP}$ load current through the coupling capacitor $C_{AC}$, charges/discharges $C_{AC}$ to $V_{CAC}$, i.e., until $[V_{PA}-(V_{LA}+V_{CAC})]$ is zeroed. At that point, the nested $I_{SW}$ control loop continues steady-state operation to drive switched converter 430 to supply $I_{SW}$ load current that minimizes the $I_{OP}$ load current required to be supplied by linear amplifier 410. For this steady-state operation (with the design-specified $V_{CAC}$ on the $C_{AC}$ coupling capacitor), the linear amplifier outputs a zero-average $I_{LA}$ current through $C_{AC}$ to the $PA_{OUT}$ summing node as the $I_{OP}$ load current.

For example, assume that switched converter 410 is sourcing current when the $I_{OP}$ load current provided by linear amplifier (LA) 410 is greater than 50 mA, and sinking current when $I_{OP}$ is below 50 mA, so that the $I_{SW}/I_{OP}$ hysteresis window is +50/−50 mA (zero-average $I_{LA}$ current). If the DC average of $V_{PA}$ is above $(V_{LA}+V_{CAC})$, then an offset current of gm times $[V_{PA}-(V_{LA}+V_{AC})]$ is input to the hysteretic comparator. If, for example, this current is 20 mA, then the new $I_{SW}/I_{OP}$ hysteretic window is +70/−30 mA, and the new LA non-zero-average $I_{LA}$ output current is approximately 20 mA, gradually charging $C_{AC}$ to increase voltage on the coupling capacitor, until the design-specified voltage $V_{AC}$ is reached (when $V_{PA}-(V_{LA}+V_{CAC})$ is zero).

Figure 5A:
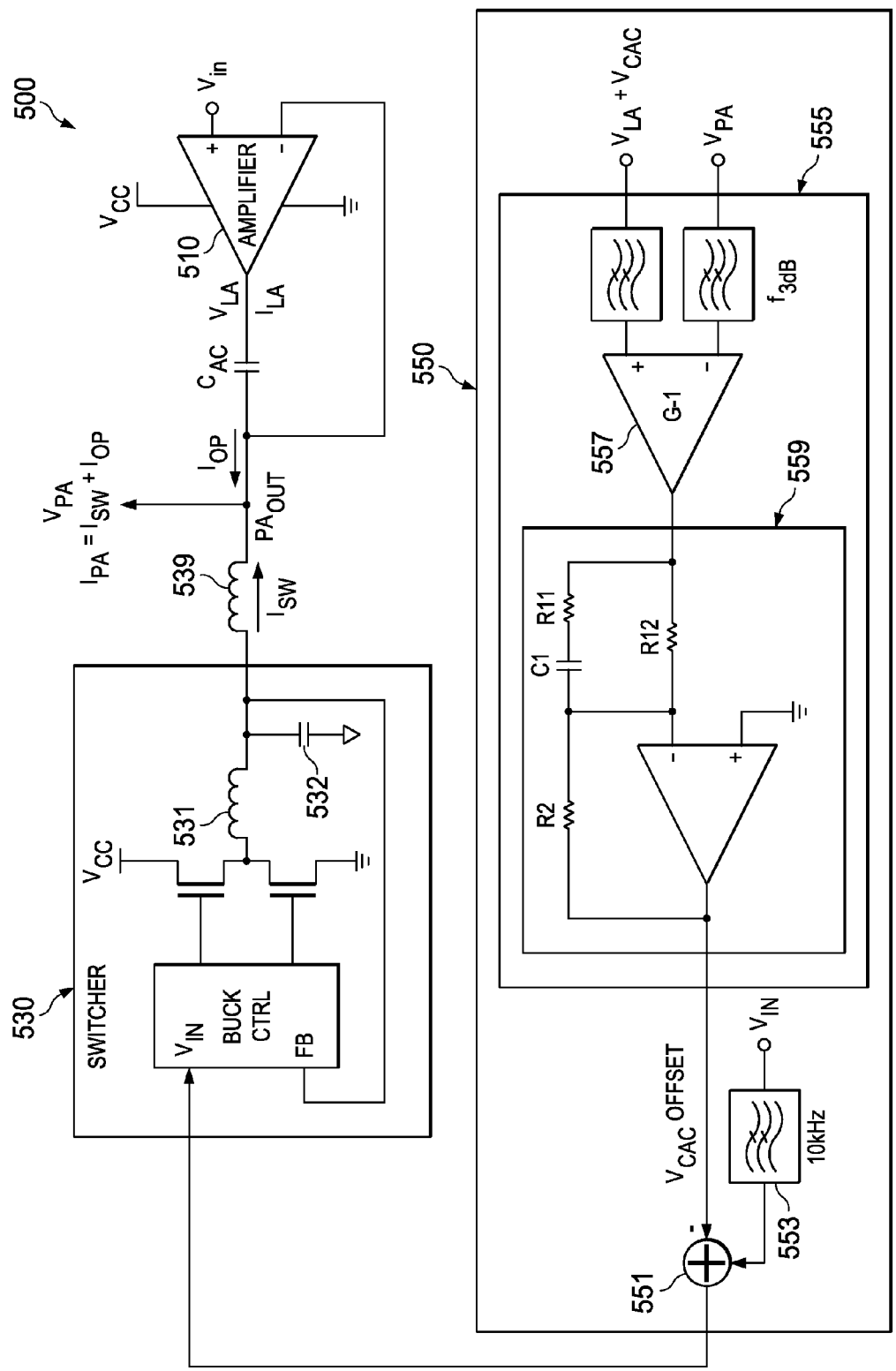
FIGS. 5A and 5B illustrate respectively an example embodiment of, and an equivalent circuit for, an alternate SMAL regulator in which the linear amplifier is AC coupled ($PA_{OUT}$ supply node) to a switched mode converter configured as a voltage supply (supplying current through an output inductor), and in which the switching (voltage) control loop is configured to effectively control the linear amplifier to provide capacitive charge control for the coupling capacitor.
Figure 5B:
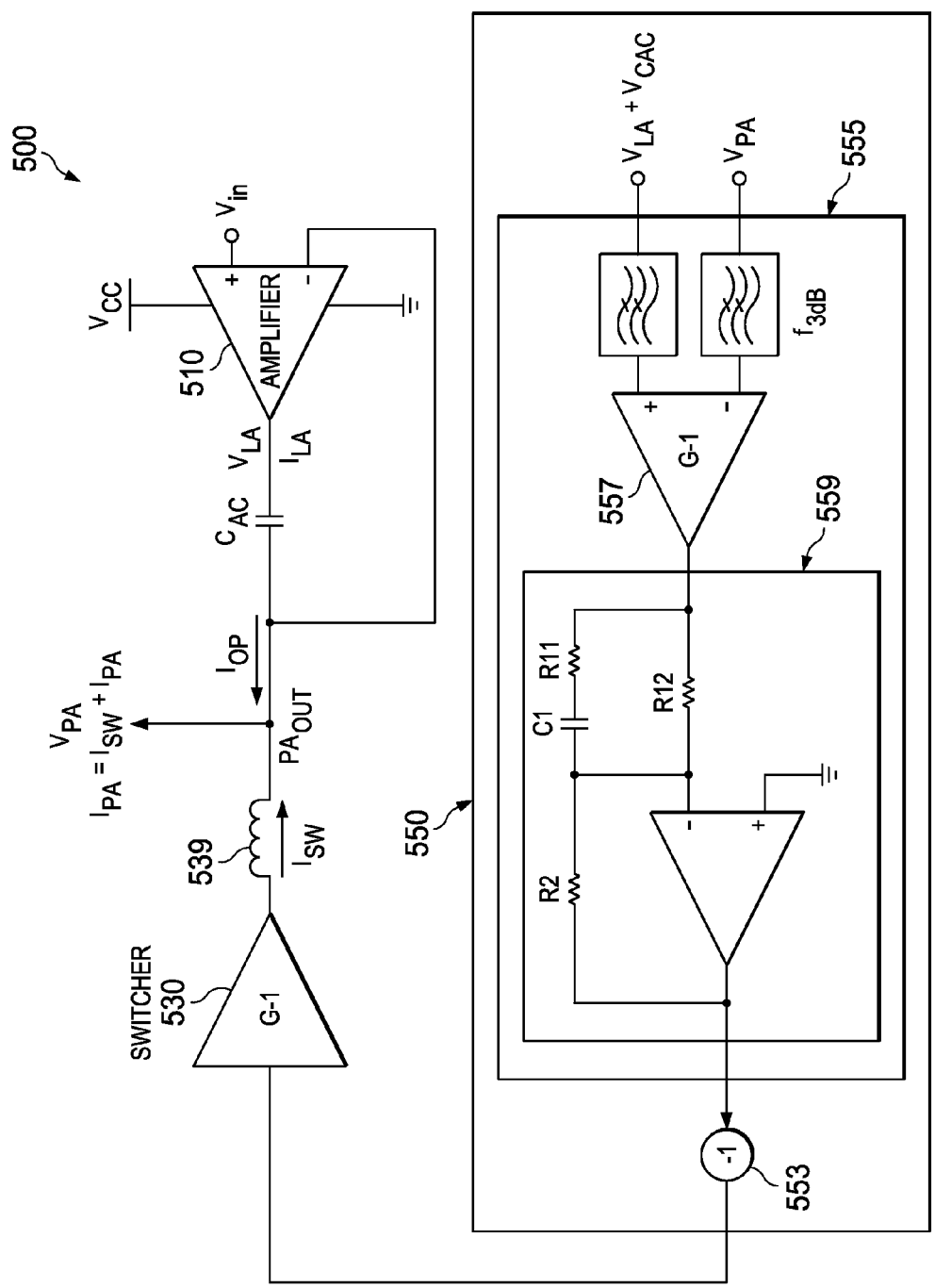
Figure 6:
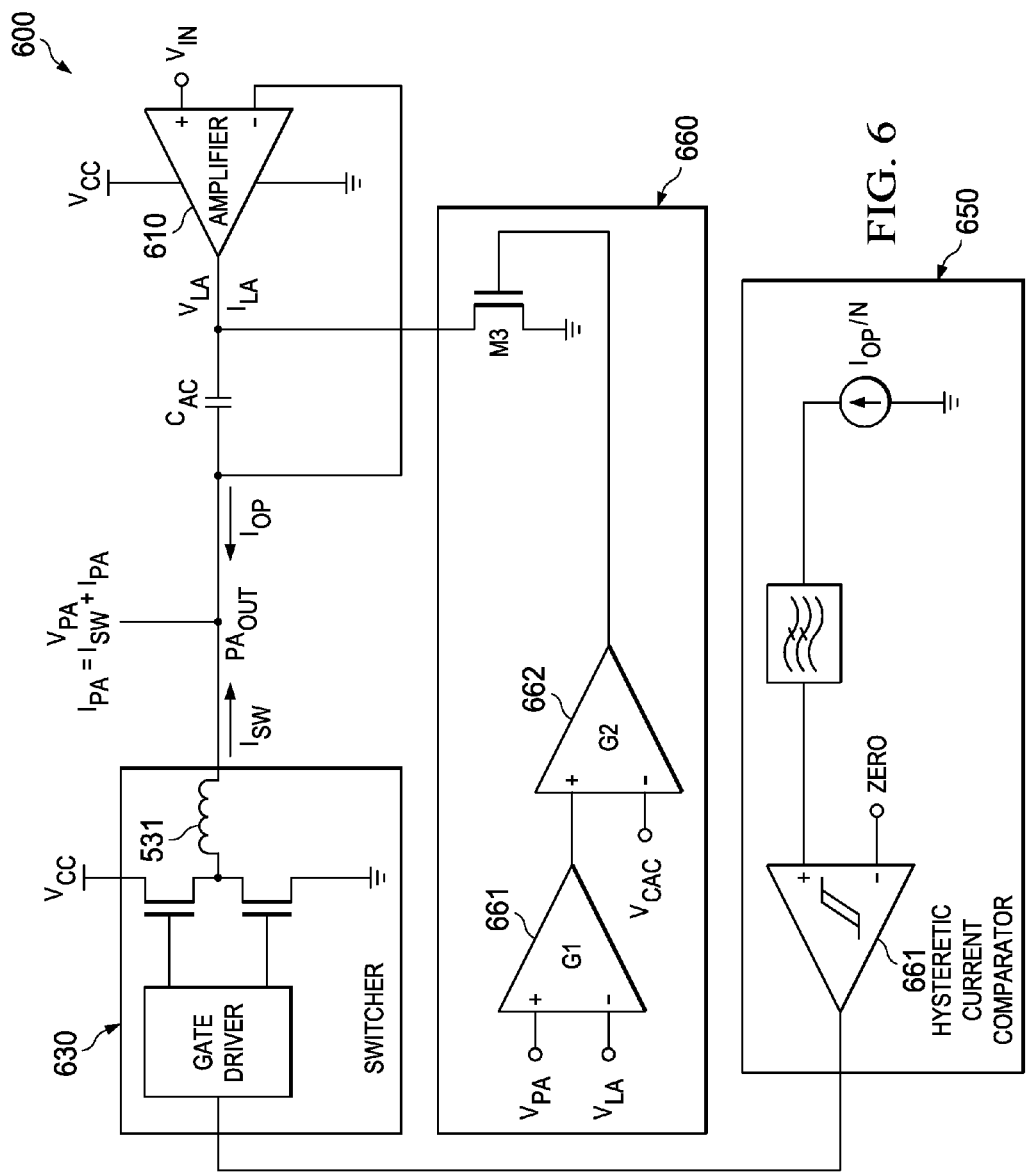
FIG. 6 illustrates an example alternate embodiment of a SMAL regulator in which the linear amplifier is AC coupled to a switched mode converter, and in which capacitive charge control is implemented by a capacitive charge control loop controlling a transistor coupled to the linear amplifier side of the coupling capacitor.

FIGS. 5A and 5B illustrate respectively an example alternate embodiment of, and an equivalent circuit for, a SMAL regulator 500 with AC coupling, adapted for high frequency applications. Linear amplifier 510 is AC coupled through a coupling capacitor $C_{AC}$ to the $PA_{OUT}$ node. For this embodiment, switched mode converter 530 is implemented as a buck voltage supply, including in addition to a buck inductor 531 a buck output capacitor 532. A switching controller 550 provides voltage control to the buck converter 530, which includes a large output inductor 539 that converts the buck voltage supply to a current supply for the $I_{SW}$ load current. Switching controller 550 includes a $V_{CAC}$ control loop 455 configured to effect capacitive charge control.

Functionally, $V_{CAC}$ control loop 555 introduces a $V_{CAC}$ offset into an $I_{SW}$ control loop $(V_{IN})$ that controls the $I_{SW}$ load current supplied by switched converter 530. Responsive to the $V_{CAC}$ offset, switched converter 530 correspondingly adjusts the $I_{SW}$ load current. current such that the linear amplifier 510 adjusts its $I_{LA}$ output current to a non-zero average. As a result, the voltage on the $C_{AC}$ coupling capacitor changes based on the average current through the $C_{AC}$ coupling capacitor to the $PA_{OUT}$ node, charging/discharging the coupling capacitor $C_{AC}$ to maintain the design-specified $V_{CAC}$ (corresponding to the design-specified DC-Average voltage $V_{PA\text{-}DC}$ on the coupling capacitor $C_{AC}$).

Switching controller 550 includes a combiner 551 that receives two signal inputs: (a) an $I_{SW}$ control signal based on the target voltage $V_{IN}$ also input to linear amplifier 510, and (b) a $V_{CAC}$ control signal from $V_{CAC}$ control loop 555 based on the voltage across the $C_{AC}$ coupling capacitor.

For the $I_{SW}$ control signal, the target voltage $V_{IN}$ is averaged by a low pass filter 553, and provides an $I_{SW}$ control input to the switched converter 530 that corresponds to the $V_{PA}$ load voltage set by linear amplifier 510. The $I_{SW}$ control input to switched converter 530 operates to control the supply voltage on the buck output capacitor 532 such that the resulting $I_{SW}$ load current through the output inductor 539 causes the linear amplifier to output (steady-state) a zero-average $I_{LA}$ output current. The $I_{LA}$ output current is coupled through the $C_{AC}$ coupling capacitor to the $PA_{OUT}$ summing node as the $I_{OP}$ load current required to be supplied by the linear amplifier 510.

$V_{CAC}$ control loop 555 is implemented with a voltage amplifier 557 followed by a compensation network 559. The resulting $V_{CAC}$ control signal introduces a $V_{CAC}$ charge control offset signal corresponding to a design-specified coupling capacitor voltage $V_{CAC}$. The output from amplifier 557 is proportional the voltage across the $C_{AC}$ referenced to $V_{CAC}$: $[V_{PA}-(V_{LA}+V_{CAC})]$. That is, the $V_{CAC}$ offset control signal introduced by the $V_{CAC}$ control loop corresponds to the difference between (a) $V_{PA}$, the PA load voltage, and (b) $(V_{LA}+V_{CAC})$, the linear amplifier output voltage $V_{LA}$ plus the design-specified coupling capacitor voltage $V_{CAC}$ (corresponding to the design-specified DC-Average voltage $V_{PA-DC}$ on the coupling capacitor $C_{AC}$). Low pass filtering these inputs reduces the requirement for high frequency common mode rejection.

When the voltage on the $C_{AC}$ coupling capacitor deviates from the design-specified $V_{CAC}$, the $V_{CAC}$ offset control signal from the $V_{CAC}$ control loop 555 $[V_{PA}-(V_{LA}+V_{CAC})]$ will be non-zero. The resulting $I_{SW}$ control signal and $V_{CAC}$ offset control signal are combined by the combiner 551, driving switched converter 530 to adjust the load current $I_{SW}$, and thereby cause linear amplifier 510 to output a non-zero-average $I_{LA}$ current corresponding to $[V_{PA}-(V_{LA}+V_{CAC})]$. This non-zero-average $I_{LA}$, in addition to providing the load current $I_{OP}$, charges/discharges the $C_{AC}$ coupling capacitor to $V_{CAC}$. i.e., until $[V_{PA}-(V_{LA}+V_{CAC})]$ is zeroed. At that point, the $I_{SW}$ control signal (corresponding to the low pass filtered target voltage $V_{IN}$) continues steady-state operation in driving switched converter 530 to supply load current $I_{SW}$ that minimizes the $I_{OP}$ load current from linear amplifier 510. The linear amplifier outputs a zero-average $I_{LA}$ current corresponding to the $I_{OP}$ load current, through the $C_{AC}$ coupling capacitor to the $PA_{OUT}$ summing node.

FIG. 5B illustrates an AC equivalent circuit of the embodiment of SMAL regulator 500 illustrated in FIG. 5A, approximating switched mode converter (buck) 530 as a voltage controlled voltage source. The transfer function of the control loop is given by $$H(s) = \frac{1+sCR_C}{sCR_L\left(\frac{sL}{R_L}+1\right)} \times \frac{1}{1+s/(2\pi f3d5)} \times \frac{R_2}{R_{12}} \frac{1+sC_1(R_{12}+R_{11})}{1+sC_1R_{11}}$$

All quantities are shown in FIG. 5B except $R_C$ which is the ESR of the coupling capacitor $C_{AC}$ (designated C in the transfer function) and $R_L$ which is the ESL of L. Poles and zeros are: P1=0; P2=−RL/L; P3=−2 nf3 dB; P4=−1/C1R11; Z1=−1CRC; Z2=−1/(C1(R12+R11)). For example: (P2) assuming ESR of 100 mOhm and L of 100 uH, this pole can be located at 160 Hz; (P3) this pole can provide additional freedom to filter out any high frequency noise across the capacitor C, caused by the linear amplifier current; (P4) this pole can provide additional freedom to filter out any high frequency noise across the capacitor C, caused by the linear amplifier current; (Z1) assuming ESR of 20 m Ohm and C of 50 uF, this zero can be located at 166 kHz (very high frequency pole); (Z2) this zero can be set to stabilize the loop and increase phase margin.

FIG. 6 illustrates an example embodiment of an alternate SMAL regulator architecture 600 with AC coupling, in which capacitive charge control is implemented in the linear amplifier stage. Specifically, linear amplifier stage 610 includes a $V_{CAC}$ (charge) control transistor M3 and associated $V_{CAC}$ control circuit 660. For the example embodiment, $V_{CAC}$ control transistor M3 is an operating mode transistor operated in the linear region to provide capacitive charge control—in another operating mode not the subject of this Patent Document, is used to ground the coupling capacitor (with the linear amplifier is disabled).

SMAL regulator 600 includes a switched converter 630 implemented as a buck current supply. The buck switched converter 630 is coupled through a buck inductor 631 to the $PA_{OUT}$ node.

A switching controller 650 is configured to control switched converter 630 to supply $I_{SW}$ load current that minimizes the $I_{OP}$ load current required to be supplied by linear amplifier 610. Switching controller 650 includes a hysteretic current comparator 651 that defines an $I_{SW}/I_{OP}$ hysteretic window. The hysteretic current comparator 651 receives an $I_{OP}/N$ input derived from an $I_{SW}$ control loop based on a current $I_{OP}/N$ corresponding to the $I_{OP}$ load current supplied by linear amplifier 610. This $I_{OP}/N$ input is compared to a zero reference corresponding to the DC average of the $I_{OP}$ load current (for AC coupled implementations, zero). The $I_{SW}$ control loop operates to drive switched converter 630 to supply $I_{SW}$ load current to minimize the $I_{OP}$ load current from the linear amplifier by maintaining $I_{OP}/N$ (low pass filtered) within the $I_{SW}/I_{OP}$ hysteretic window. As a result, linear amplifier 610 outputs (steady-state) a zero-average output current $I_{LA}$, coupled through the $C_{AC}$ coupling capacitor to the $PA_{OUT}$ summing node as the $I_{OP}$ load current supplied by the linear amplifier 610.

$V_{CAC}$ control loop 660 includes cascade differential amplifiers 661 and 662, configured to implement $V_{CAC}$ control based on the voltage across the $C_{AC}$ coupling capacitor (corresponding to the design-specified DC-Average voltage $V_{PA-DC}$). The output of amplifier 662 provides a $V_{CAC}$ control signal to the M5 control gate.

$V_{CAC}$ control loop 660 can be represented as $[V_{PA}-(V_{LA}+V_{CAC})]$, or for the configuration of FIG. 6, $[(V_{PA}-V_{LA})-V_{CAC}]$. That is, the amplifiers 661/662 generate the $V_{CAC}$ control signal which corresponds to the voltage across the coupling capacitor $(V_{PA}-V_{LA})$ relative to the design-specified voltage $V_{CAC}$ (corresponding to the design-specified DC-Average voltage $V_{PA-DC}$ on the coupling capacitor $C_{AC}$). In particular, feedback ensures that $V_{CAC}$ applied to the negative input of amplifier 662 will appear across the $C_{AC}$ coupling capacitor, which allows precise control of the $V_{CAC}$ coupling capacitor voltage.

When the voltage on the $C_{AC}$ coupling capacitor deviates from the design-specified $V_{CAC}$ (non-zero $[(V_{PA}-V_{LA})-V_{CAC}]$) the $V_{CAC}$ control signal from $V_{CAC}$ control loop 660 (amplifier 662) controls M3 to effect charging/discharging the coupling capacitor $C_{AC}$, until $[(V_{PA}-V_{LA})-V_{CAC}]$ is zeroed. The separate $I_{SW}$ control loop 650 continues steady-state operation, driving switched converter 630 to supply $I_{SW}$ load current that minimizes the $I_{OP}$ load current required to be supplied by the linear amplifier 610. In this steady-state case (with $V_{CAC}$ on the $C_{AC}$ coupling capacitor), linear amplifier 610 outputs a zero-average $I_{LA}$ current through $C_{AC}$ to the $PA_{OUT}$ summing node as the $I_{OP}$ load current.

Decoupling Output Impedance and Signal Path Bandwidth.

Figure 7A:
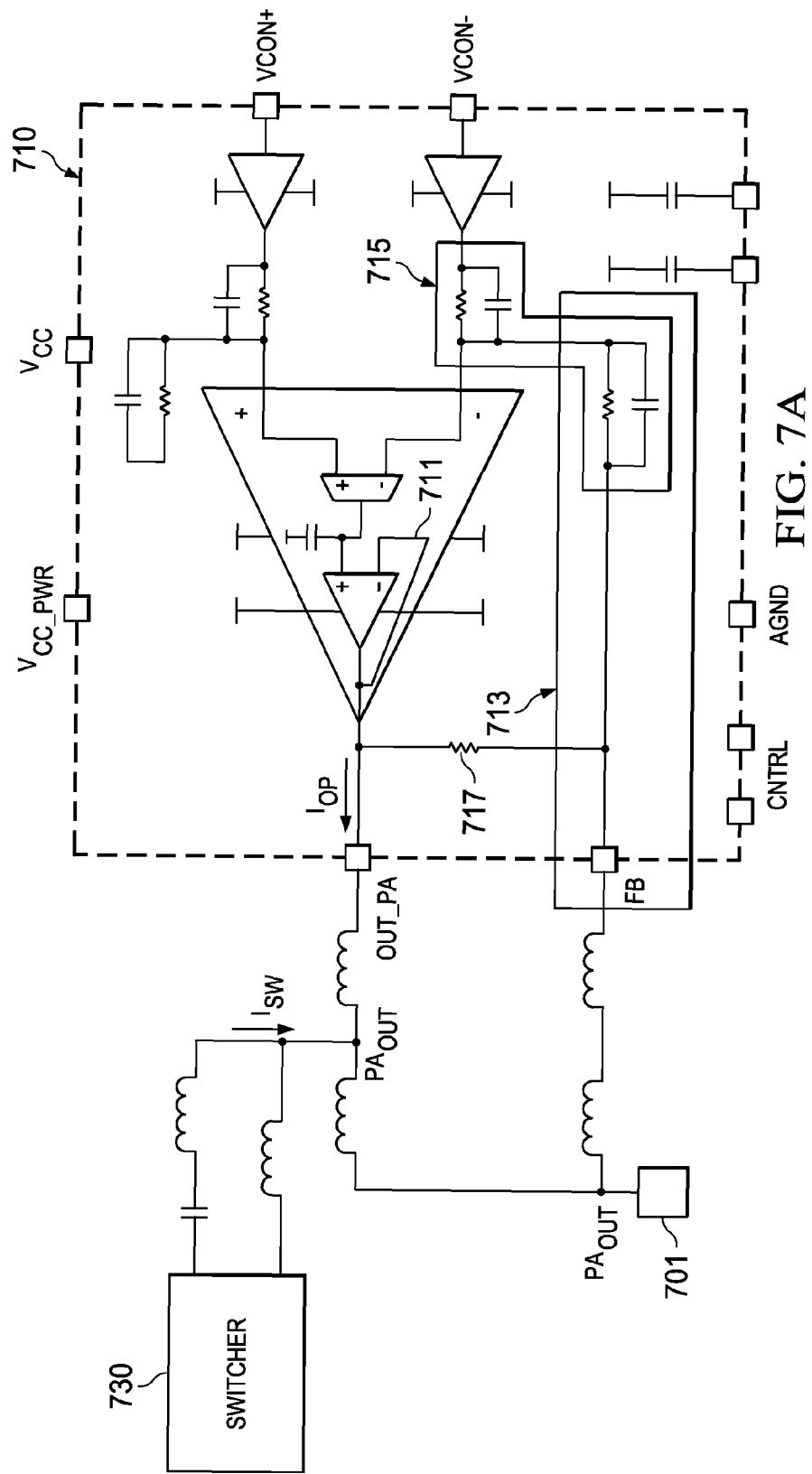
FIG. 7A illustrates an example embodiment of a SMAL regulator including a linear amplifier design with decoupled output impedance and signal path bandwidth, including a local/internal (higher speed) feedback loop configured for increased output impedance bandwidth, and an external feedback network configurable to establish signal path bandwidth independent of output impedance bandwidth.
Figure 7B:
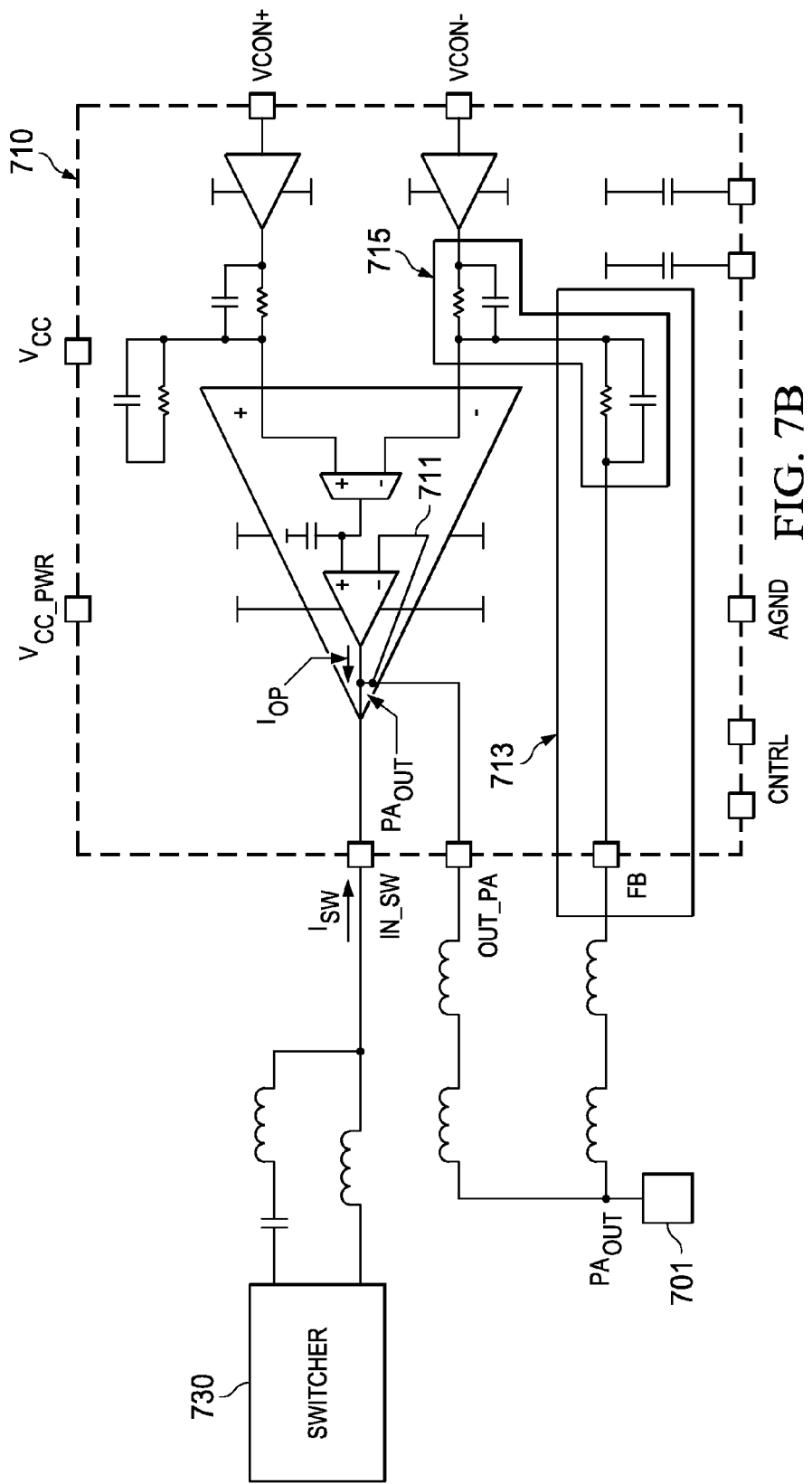
FIG. 7B illustrates an example alternate embodiment of the SMAL regulator of FIG. 7A, in which the switched mode converter is coupled directly to the local/internal feedback loop of the linear amplifier, reducing parasitic trace inductance (coupled, for an example IC implementation, to a dedicated IN_SW pin).

FIGS. 7A and 7B illustrate example embodiments of SMAL regulator 700 in a system configuration with a power amplifier 701 (such as for use in the RF transmitter system illustrated in FIG. 1A/B). SMAL regulator 700 includes linear amplifier 710 and a switched mode converter 730, parallel coupled at an output node $PA_{OUT}$ to PA 701. Control for the switched mode converter is integrated with the switched mode converter and not separately illustrated (compare, for example, controller 250 in FIG. 2).

As illustrated, the example embodiments of SMAL regulator 700 are configured with DC coupling (such as also illustrated in FIG. 2). With appropriate modification, the Description related to these embodiments would also apply to AC coupled embodiments/implementations.

As illustrated, linear amplifier 710 and switched converter 730 are implemented as separate integrated circuits (ICs) a SMAL regulator according to this Disclosure can be adapted to a single-IC implementation. System interconnect will necessarily include trace inductance that can impact operation at higher frequencies (discussed in connection with the embodiment in FIG. 7B).

SMAL regulator 700 supplies to the PA ($PA_{OUT}$) regulated voltage $V_{PA}$ and current $I_{PA}$. In accordance with this Disclosure, (a) PA load voltage $V_{PA}$ is dynamically set by the linear amplifier 710, and (b) PA load current $I_{PA}$ is supplied by linear amplifier 710 with primary current assist supplied by switched converter 730. Switched converter 730 is configured to supply lower frequency $I_{SW}$ load current, and the linear amplifier 710 is configured to supply $I_{OP}$ load current not supplied by the switched converter, i.e., sourcing/sinking PA load current $I_{PA}$ not supplied by the switched converter). $I_{SW}$ and $I_{OP}$ are summed at the $PA_{OUT}$ supply node.

Linear amplifier 710 outputs voltage $V_{LA}$ and current $I_{LA}$. For the example DC coupled implementations, output voltage $V_{LA}$ corresponds to the regulated load voltage $V_{PA}$ supplied to PA 701, and output current $I_{LA}$ corresponds to the load current $I_{OP}$ supplied by the linear amplifier. For the example IC implementations, $V_{LA}$ and $I_{LA}$ are available at an output pin OUT_PA.

The example embodiment of a linear amplifier design 710 can be configured for decoupling output impedance and signal path bandwidth, enabling signal path bandwidth to be established relatively independent of output impedance bandwidth. The linear amplifier includes a local/internal (higher speed) feedback loop configured for controlling output impedance bandwidth, and a global/external feedback network configurable to independently establish signal path bandwidth. As used in this Disclosure, output impedance bandwidth refers to the bandwidth over which the output impedance of a SMAL regulator remains low relative to the frequencies of interest and the load.

Figure 8:
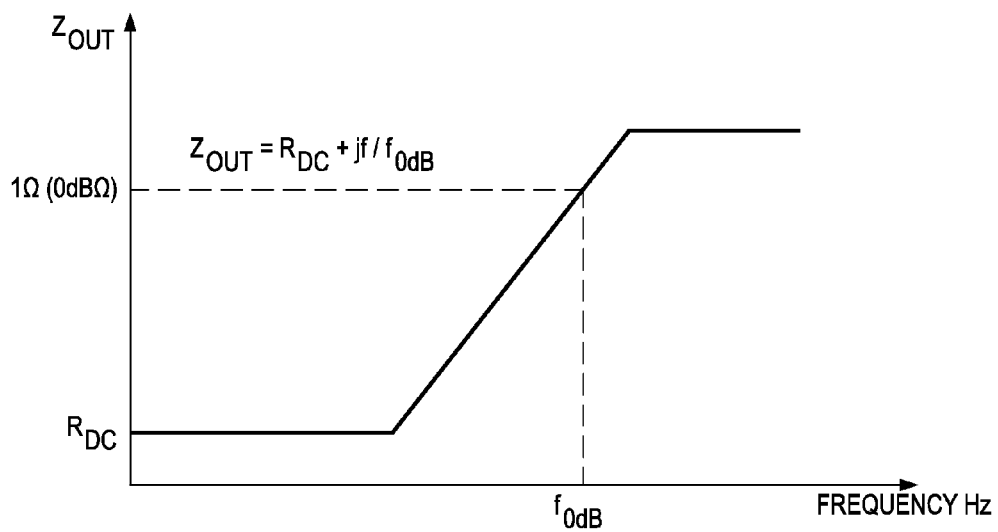
FIG. 8 illustrates closed-loop output impedance ($Z_{OUT}$) as a function of frequency.

FIG. 8 illustrates the relationship between closed-loop output impedance (Zout) and frequency—this description will be in the context of a negative feedback operational amplifier which corresponds in relevant respects to a linear amplifier such as used in a SMAL regulator according to this Disclosure. The closed-loop output impedance Zout is characterized by a low resistance $R_{DC}$ at lower frequencies where the amplifier has significant loop gain. At higher frequencies, the amplifier loop gain drops and output impedance Zout increases. A design parameter is the zero dB crossing frequency f0 dB (ZCF), defined as the frequency at which system output impedance rises to zero dB-ohms (1 ohm in non-dB units).

In the context of the example RF application, the higher the ZCF for the output impedance of the linear amplifier, the higher the output impedance bandwidth, and the lower the RX band noise at a power amplifier. That is, a linear amplifier with a high ZCF relative to the RF frequencies of interest is advantageous in actively rejecting high-frequency voltage disturbances introduced internal to a SMAL regulator by the switched mode converter, or externally from the dynamic PA load (noise output from the PA supply pin). Thus, it can be advantageous to increase output impedance bandwidth (increase ZCF) to reduce RX band noise. However, a design trade-off can be to reduce signal path bandwidth to increase efficiency (that is, limiting signal path bandwidth to the bandwidth requirement for envelope tracking) and/or increase design flexibility (such as by reducing design complexity).

FIGS. 7A/7B include a high level example functional illustration of a linear amplifier design 710, including decoupling output impedance bandwidth from signal path bandwidth. Specific implementations of a linear amplifier for use in a SMAL regulator according to this Disclosure represent a design choice, and other amplifier architectures are adaptable as a linear amplifier according to this Disclosure, including implementing design alternatives and/or trade-offs to improve efficiency under different operating conditions and for different applications.

Referring to FIG. 7A, linear amplifier 710 receives a differential envelope tracking signal (VCON+/−), such as from an RFIC (this differential signal corresponds to $V_{IN}$ in FIGS. 2, 4, 5A/5B and 6). In response, linear amplifier 710 supplies a regulated, single-ended load voltage $V_{PA}$ (or $V_{LA}$) to the PA 701.

Linear amplifier 710 includes both an internal (higher speed) feedback loop 711 configured for reducing output impedance at the frequencies of interest, and an external (lower speed) feedback network 713 configured to establish signal path bandwidth. For the illustrated IC implementation, the external feedback network 713 is connected to $PA_{OUT}$, between the FB and OUT_PA pins.

The local/internal (higher speed) feedback loop 711 enables increased output impedance bandwidth. The internal feedback loop 711 reduces output impedance at higher frequencies, increasing zero crossing frequency (ZCF in FIG. 8), and thereby increasing output impedance bandwidth. A capacitive divider network 715 at the inverting VCON− input to linear amplifier 710 can be used to provide further control at higher frequencies.

The global/external feedback network 713 can be configured to establish signal path bandwidth, including optimizing SMAL regulator 700 for reduced signal path bandwidth leading to increased efficiency. For example, using relatively large resistive values in the external feedback loop 713 will slow the feedback loop, and reduce signal path bandwidth, without appreciably affecting output impedance bandwidth for the frequencies of interest. In addition, a parallel resistance 717 can be used to stabilize the external feedback loop 713 at high frequencies by shorting the (trace) inductance in the feedback loop between the OUT_PA and FB pins, thereby improving phase margin.

FIG. 7B illustrates an example alternate embodiment of the SMAL regulator 700 of FIG. 7A, in which switched converter 730 is connected at the output of the linear amplifier 710, effectively at the local/internal feedback loop 711, reducing parasitic trace inductance between switched converter 730 and linear amplifier 710. For the example IC implementation, switched converter 730 connects to a separate IN_SW pin of linear amplifier 710. With this system interconnect configuration, the $PA_{OUT}$ node is effectively at the linear amplifier, reducing the affects of trace inductance (distortion caused by switching and ripple noise).

Seamless Transition Between Power Tracking Configurations.

Figure 9B:
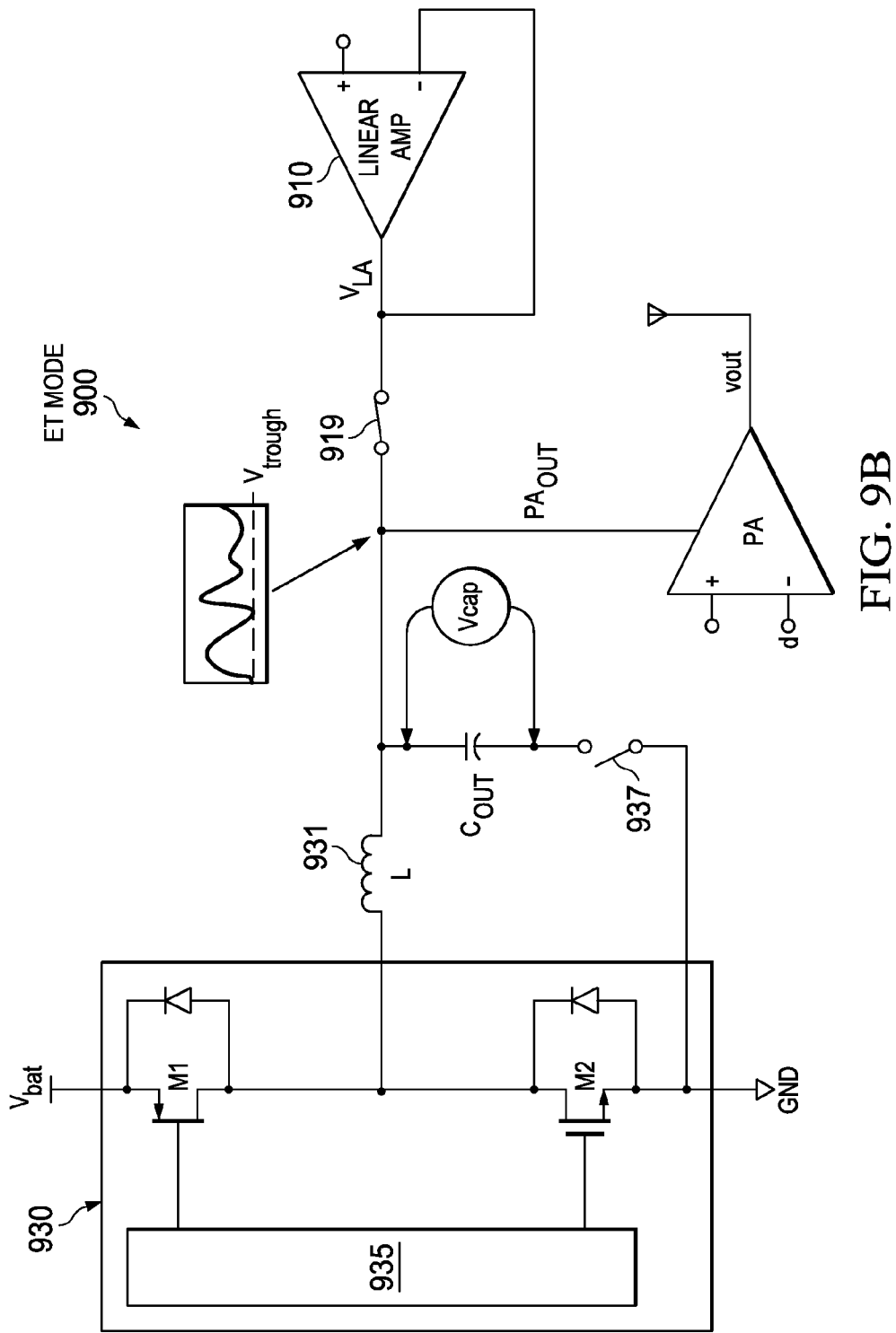
Figure 9C:
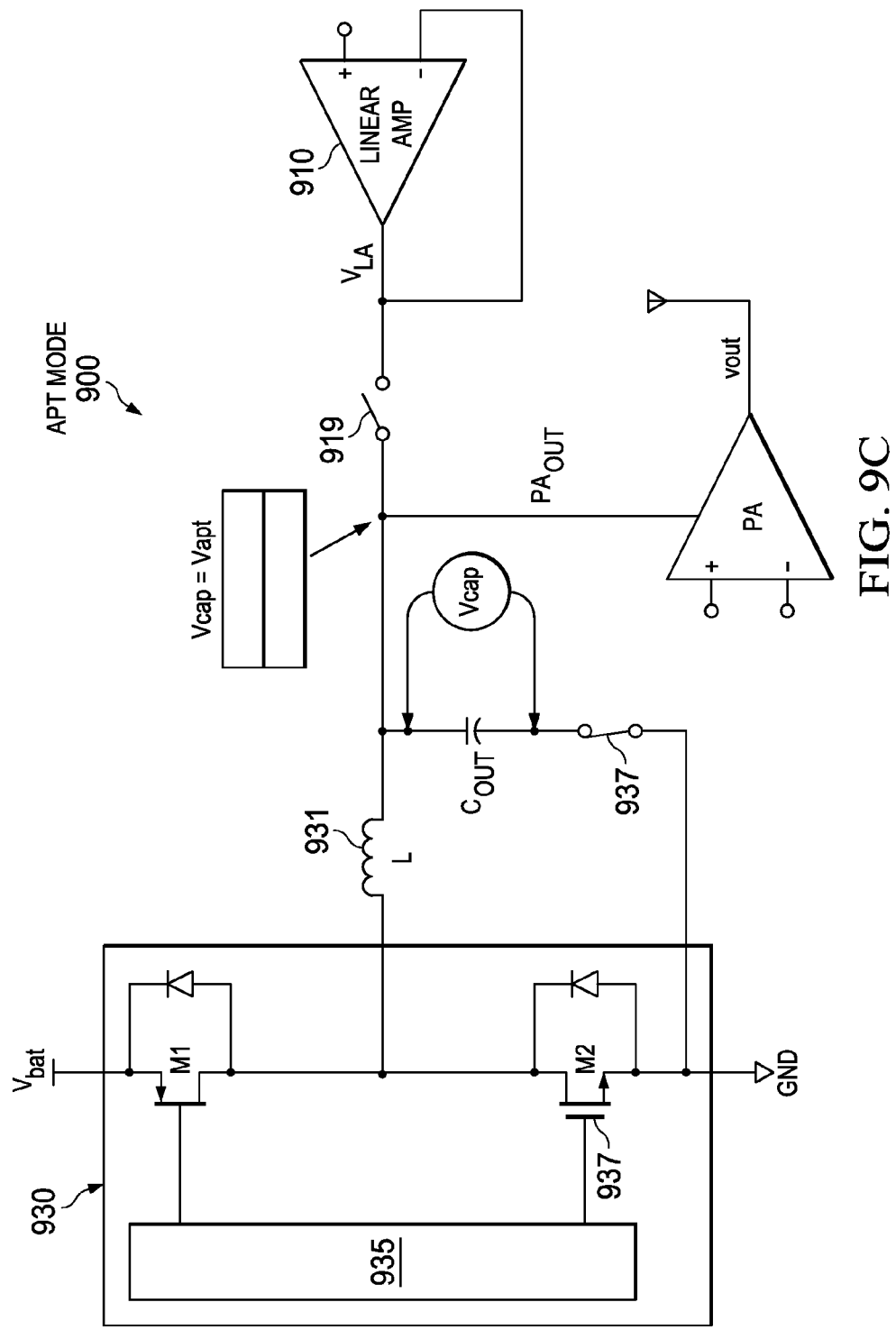

FIGS. 9A, 9B, 9C illustrates an example embodiment of a regulator 900 configured for substantially seamless transitioning between two configuration/tracking modes: a relatively higher bandwidth (higher power) envelope tracking/modulation (ET) mode, such as described above, and a relatively lower bandwidth (lower power) adaptive power tracking (APT) mode. Regulator 900 is an ET-AT configurable version of the SMAL regulator 200 illustrated in FIG. 2, including a linear amplifier 910 DC-coupled to a switched converter 930 at a $PA_{OUT}$ supply node.

In brief overview of the example embodiment illustrated in FIG. 9, the SMAL regulator is selectively configurable as a power supply operable in two tracking modes, with respective tracking bandwidths related to the power bandwidth of the load, with seamless transition between power tracking configurations (tracking modes). The power supply includes an amplifier circuit, and a switched mode converter (switcher) circuit coupled in parallel at a supply node coupled to load, and an output capacitor coupled to the supply node. The power supply is selectively configurable for operation in: (a) an envelope tracking (ET) mode during an ET frame in which the amplifier circuit and the switcher circuit are switch-configured as a switch mode assisted linear (SMAL) regulator, with the amplifier circuit switch-coupled to the supply node, and operable to set the regulated load voltage with an envelope tracking bandwidth, and to supply load current not supplied by the switcher circuit, and with the switcher circuit operable as a controlled current source supplying switcher current at a switcher bandwidth less than the envelope tracking bandwidth; and (b) an adaptive tracking (AT) mode during an AT frame in which the amplifier circuit is switch-decoupled from the supply node and inactive, and the switcher circuit and the output capacitor are switch-configured as a switched mode power supply (SMPS) operable to set the regulated load voltage at the supply node, and supply the load current, with an adaptive tracking bandwidth that is less than the envelope tracking bandwidth. The power supply further includes staged switch array circuitry, including (a) a first transistor mode switch coupled between a bottom plate of the output capacitor and ground, and (b) a second transistor mode switch coupled between the amplifier circuit and the supply node. The staged switch array circuitry can be configured to control transitions between the tracking mode configurations using staged switching to effect two transition modes in which the amplifier circuit operates in a constant voltage envelope tracking (CVET) mode such that the load voltage at the supply node is held at a substantially constant CVET voltage: (a) an ET-AT transition mode initiated at an AT frame boundary by controlling the first transistor mode switch to switch-couple the bottom plate of the output capacitor to ground, and operating the amplifier circuit in CVET mode to hold the supply node at a CVET voltage corresponding to a target AT voltage, enabling the output capacitor to pre-charge to the target AT voltage, and then controlling the second transistor mode switch to de-couple the amplifier circuit from the supply node, thereby transitioning to the SMPS configuration operating in AT tracking mode; and (b) an AT-ET transition mode initiated prior to an ET frame boundary, by controlling the second transistor mode switch to switch-couple the amplifier circuit to the supply node, and operating the amplifier circuit in CVET mode to hold the supply node at a CVET voltage corresponding to an APT voltage on the output capacitor, and then controlling the second transistor mode switch to de-couple the bottom plate of the output capacitor from ground, enabling the output capacitor to discharge, thereby transitioning to the SMAL regulator configuration operating in ET tracking mode.

Referring to FIGS. 9A and 9B, for ET mode, regulator 900 is configured as a SMAL regulator with linear amplifier 910 assisted by switched converter 930 operating as a controlled current supply. In this configuration, the ET linear amplifier is connected to the $PA_{OUT}$ node by switch 919, and an APT output filter capacitor $C_{OUT}$ is disconnected by switch 937.

Referring to FIGS. 9A and 9C, for APT mode, SMAL regulator 900 is configured as a switched mode power supply, providing regulated voltage and current to the PA. For this configuration, the output filter capacitor $C_{OUT}$ is switch-connected 937 at $PA_{OUT}$, and the linear amplifier 910 is switch disconnected/disabled 919.

For system reconfiguration, regulator 900 and linear amplifier 910 are operated in a CVET (constant voltage envelope tracking) transition mode that minimizes perturbations in the $PA_{OUT}$ supply voltage.

For ET mode, as described in connection with FIG. 2, linear amplifier 910 supplies an envelope tracking load voltage $V_{PA}$, and the switched converter 930 is configured as a current supply, supplying an $I_{SW}$ component of the $I_{PA}$ load current ($I_{PA}=I_{OP}+I_{SW}$). Switcher 930 can be controlled to maximize $I_{SW}$ to reduce the requirement for linear amplifier 910 to supply load current $I_{OP}$.

For certain PA operating conditions, it is advantageous to switch from operating in a relatively higher bandwidth envelope tracking mode, to a relatively lower bandwidth tracking mode designated adaptive power tracking or APT. In APT mode, the lower-efficiency linear amplifier is disabled/disconnected, and the switched converter is reconfigured for operation as a higher efficiency DC switched mode power (voltage) supply, albeit, with relatively lower tracking bandwidth.

Figure 9D:
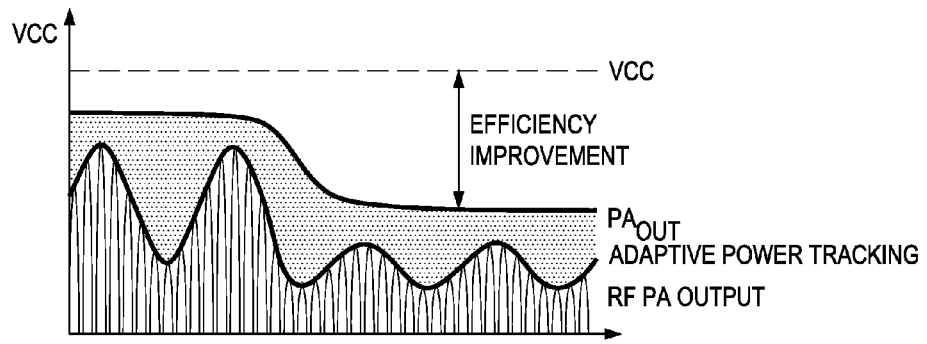
FIG. 9D illustrates an example APT operating mode for a SMAL regulator, providing relatively low APT-tracking bandwidth in the context of an example application as a power supply for an RF PA.

FIG. 9D illustrates APT operation in the context of the example application of a SMAL regulator for an RF PA with an RF PA output. In ET mode, $PA_{OUT}$ supplied to the PA would effectively track the RF PA output. In APT mode, the regulated $PA_{OUT}$ supply voltage does not envelope track the RF PA output. Instead, tracking bandwidth is reduced, for example by tracking peak signal power, which still provides substantial efficiency improvement over using a fixed-VCC supply voltage.

Referring to FIGS. 9A and 9C, for APT mode, regulator 900 is reconfigured as a switched mode power supply (voltage regulator) by switch-connecting an output filter capacitor Coot in parallel with the $PA_{OUT}$ supply node, and switch-disconnecting the linear amplifier 910. In effect, $C_{OUT}$ replaces the linear amplifier 910 in filtering switching noise from the switched converter 930. In this APT mode, the switched mode (buck) power supply 930 is configured with buck inductor 931 and output filter capacitor $C_{OUT}$, operating in APT mode with adaptive power tracking to supply regulated load voltage $V_{PA}$ and load current $I_{PA}$ ($I_{SW}$) through the $PA_{OUT}$ supply node.

For ET-APT-ET transitions, abruptly switch-connecting/disconnecting the output filter capacitor $C_{OUT}$ can cause perturbations at the $PA_{OUT}$ supply node the will be injected as noise into the PA supply pin. According to aspects of the invention, ET-AT-ET transitions are effected substantially seamlessly by operating the SMAL regulator 900 in CVET transition mode to manage the charging/discharging $C_{OUT}$ so as to minimize $PA_{OUT}$ perturbations.

The CVET transition mode is used to effect ET-APT-ET reconfiguration of SMAL regulator 900 using a staged switch array including FETs 919 and 937. During a CVET transition period, at ET-AT-ET mode/frame boundaries, FETs 919/937 are switched in stages to connect/disconnect the output filter capacitor $C_{OUT}$.

In CVET transition mode, during the CVET transition period, linear amplifier 910 provides constant voltage envelope tracking (CVET) to enable connection/disconnection of the output filter capacitor $C_{OUT}$ without introducing perturbations in the $PA_{OUT}$ supply voltage. As a result, transitions between ET and APT configurations and operating modes are substantially seamless. CVET transition mode operates during ET-APT-ET transitions to manage charging/discharging the output filter capacitor $C_{OUT}$.

Design-considerations that affect the configuration of the switch array 919/937 included capacitance at the SMAL regulator supply node $PA_{OUT}$, and Rdson. The switch array can be advantageously configured so that it does not introduce appreciable capacitance at the $PA_{OUT}$ supply node. FETs 919/937 can be advantageously selected to minimize Rdson to enable rapid charge/discharge of $C_{OUT}$, and, during $C_{OUT}$ discharge (APT-ET transitions), to reasonably limit the discharge current especially for high initial Cout voltages. The a staged FET switch array can be driven with a locally generated boosted gate voltage (high Vgs).

Figure 9E:
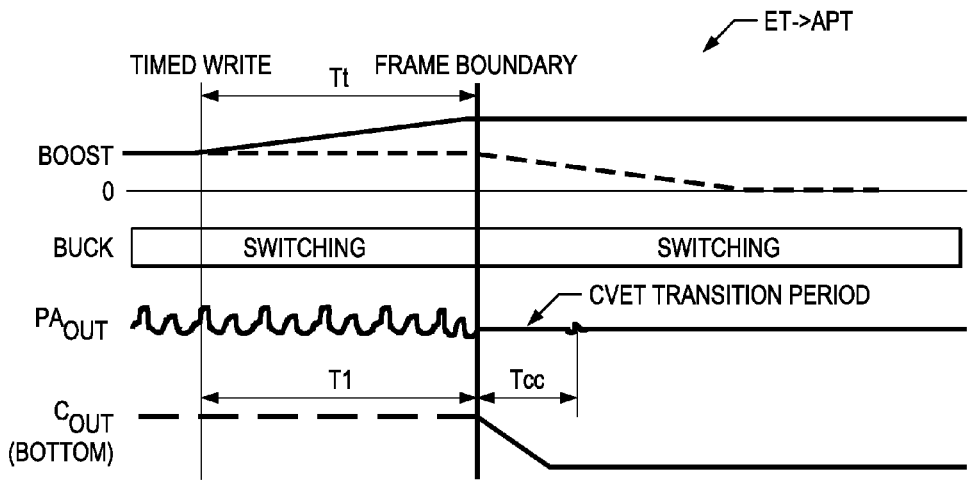
FIGS. 9E and 9F provide example waveforms that illustrate an example embodiment of CVET transition mode control for substantially seamless transitions between ET-APT-ET modes or frames, including operating the linear amplifier in constant voltage envelope tracking (CVET) mode during CVET transition periods at frame boundaries to minimize perturbations in $PA_{OUT}$ supply voltage: (9D) illustrates transition from ET to APT mode in which the linear amplifier remains active during a CVET transition period at the beginning of an APT frame, enabling controlled connect and pre-charge of the output filter capacitor $C_{OUT}$; and (9E) illustrates transition from APT to ET mode in which the linear amplifier is activated during a CVET transition period at the end of an APT frame, enabling controlled disconnect and discharge of $C_{OUT}$.

FIG. 9E illustrates ET-APT mode transition, including operating the linear amplifier in CVET transition mode at the beginning of an APT frame, during a CVET transition period with a duration $T_{CC}$. For substantially seamless transition to the APT operating mode, while the linear amplifier continues to set $PA_{OUT}$ voltage, the output filter capacitor $C_{OUT}$ is pre-charged to a target APT voltage without significantly perturbing the $PA_{OUT}$ supply voltage.

Referring also to FIG. 9A, in CVET transition mode, linear amplifier 910 operates at a constant voltage corresponding to the target APT voltage for the beginning of the APT frame. During the transition period $T_{CC}$, while linear amplifier is setting the $PA_{OUT}$ voltage, the output filter capacitor $C_{OUT}$ is switch-connected 937 at the output of switched converter 930, and pre-charged from the switched converter 930 to the target initial APT voltage.

Thus, for substantially seamless transition to the APT operating mode, during the CVET transition period $T_{CC}$, FET 919 remains active, connecting linear amplifier 910 to the $PA_{OUT}$ supply node, so that the linear amplifier continues to set the $PA_{OUT}$ supply voltage. In effect, ET mode, with the linear amplifier active, is extended past the ET-APT frame boundary for the duration of the CVET transition period $T_{CC}$.

With the linear amplifier maintaining a constant $PA_{OUT}$ supply voltage (APT target voltage), FET 937 is activated to connect the bottom plate of the output filter capacitor $C_{SWOUT}$ to ground, enabling switched converter 930 to pre-charge $C_{SWOUT}$ from 0V (discharged) to the APT target voltage without significantly perturbing the $PA_{OUT}$ supply voltage. At the end of the CVET transition period $T_{CC}$, when $C_{OUT}$ is pre-charged to the target APT voltage, linear amplifier 910 is then switch-disconnected 919 from the $PA_{OUT}$ supply node.

In this manner, the CVET transition mode enables substantially seamless transition from the ET to APT tracking, including staged switching to connect and pre-charge output filter capacitor $C_{OUT}$, while linear amplifier 910 maintains a constant $PA_{OUT}$ supply voltage. When linear amplifier 910 is disabled at the end of the CVET transition period, regulator 900 is reconfigured for operation as a switched mode power supply (buck), without introducing significant perturbations into the $PA_{OUT}$ supply voltage.

Figure 9F:
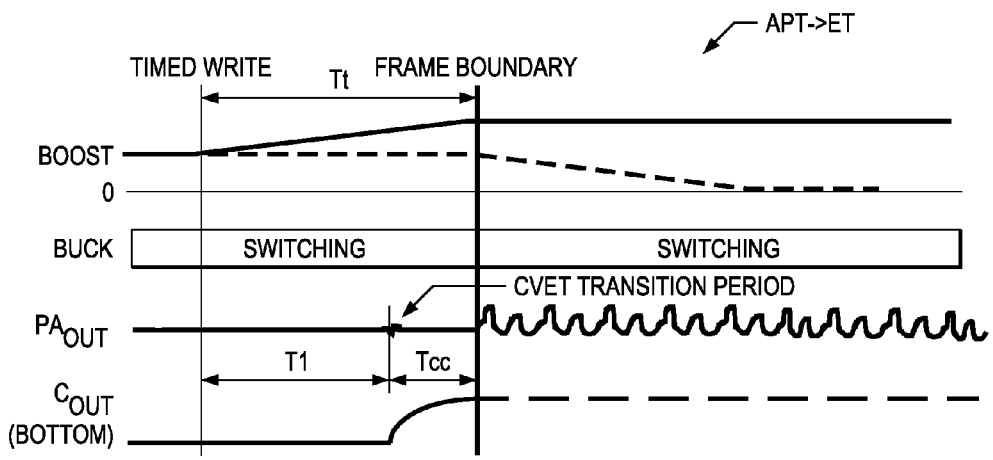

FIG. 9F illustrates APT-ET mode transition, including operating in CVET transition mode at the end of an APT frame, during a CVET transition period, with a duration $T_{CC}$. For substantially seamless transition to the ET operating mode, the output filter capacitor $C_{OUT}$ is disconnected and discharged without significantly perturbing the $PA_{OUT}$ supply voltage.

Referring also to FIG. 9A, during a CVET transition period at the end of the APT frame, FET 919 is activated to switch-connect linear amplifier 910 to the $PA_{OUT}$ supply node, enabling the linear amplifier to set the $PA_{OUT}$ supply voltage. As with ET-APT transitions, in CVET transition mode, linear amplifier 910 operates at a constant voltage corresponding to the APT voltage at the end of the APT frame. In effect, ET mode is initiated prior to the APT-ET frame boundary, but with linear amplifier 910 operating in CVET mode to hold the $PA_{OUT}$ supply voltage constant (APT voltage) for the duration of the CVET transition period $T_{CC}$.

With the $PA_{OUT}$ supply voltage held constant, output filter capacitor $C_{OUT}$ is removed by deactivating FET 937 to disconnect the bottom plate of $C_{OUT}$ from ground, and $C_{OUT}$ is discharged without introducing significant perturbations into the $PA_{OUT}$ supply node, which is held constant by the (higher bandwidth) linear amplifier 910. By the end of the CVET transition period $T_{CC}$, at the APT-ET frame boundary, $C_{OUT}$ is disconnected and discharged in preparation for ET mode operation.

In this manner, a substantially seamless transition from the APT to the ET tracking is accomplished by operation of the CVET transition mode, including staged switching to connect linear amplifier 910, and, while the linear amplifier maintains a constant $PA_{OUT}$ supply voltage, disconnecting/discharging output filter capacitor $C_{OUT}$. Regulator 900 is reconfigured for operation as a switched mode assisted linear regulator without introducing significant perturbations into the $PA_{OUT}$ supply voltage.

Example embodiments of the switched mode assisted linear amplifier/regulator architecture have been described in the context of an example application as an envelope modulated (or tracking) power supply for an RF power amplifier. Other applications for a SMAL amplifier/regulator architecture according to this Disclosure include audio power supplies, audio amplifiers (with integrated power) and power line communications.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. A power supply operable to supply a regulated load voltage and associated load current to a dynamic load characterized by a power bandwidth, comprising:
    an amplifier circuit and a switched mode converter (switcher) circuit coupled in parallel at a supply node coupled to the load; and an output capacitor coupled to the supply node;
the power supply selectively operable in two tracking modes during respective frames, with tracking bandwidths related to the load power bandwidth:
an envelope tracking (ET) mode during ET frames in which the amplifier circuit and the switcher circuit are operable as a switch mode assisted linear (SMAL) regulator, with the amplifier circuit switch-coupled to the supply node, and operable to set the regulated load voltage with an envelope tracking bandwidth, and to supply load current not supplied by the switcher circuit, and with the switcher circuit operable as a controlled current source supplying switcher current at a switcher bandwidth less than the envelope tracking bandwidth; and
an adaptive tracking (AT) mode during AT frames in which the amplifier circuit is switch-decoupled from the supply node, and the switcher circuit and the output capacitor are operable as a switched mode power supply (SMPS) operable to set the regulated load voltage, and to supply the load current, with an adaptive tracking bandwidth that is less than the envelope tracking bandwidth;
staged switch array circuitry, including:
a first transistor mode switch coupled between a bottom plate of the output capacitor and ground; and
a second transistor mode switch coupled between the amplifier circuit and the supply node;
the staged switch array circuitry to control transitions between the tracking modes using staged switching to effect two transition modes, during which the amplifier circuit is operated in constant voltage envelope tracking (CVET) mode such that the load voltage at the supply node is held at a substantially constant CVET voltage:
an ET-AT transition mode initiated at an AT frame boundary by controlling the first transistor mode switch to switch-couple the bottom plate of the output capacitor to ground, and operating the amplifier circuit in CVET mode to hold the supply node at a CVET voltage corresponding to a target AT voltage, enabling the output capacitor to precharge to the target AT voltage, and then controlling the second transistor mode switch to decouple the amplifier circuit from the supply node, thereby transitioning for operation as the SMPS in AT tracking mode; and
an AT-ET transition mode initiated prior to an ET frame boundary by controlling the second transistor mode switch to switch-couple the amplifier circuit to the supply node, and operating the amplifier circuit in CVET mode to hold the supply node at a CVET voltage corresponding to an APT voltage on the output capacitor, and then controlling the second transistor mode switch to decouple the bottom plate of the output capacitor from ground, enabling the output capacitor to discharge, thereby transitioning for operation as the SMAL regulator in ET tracking mode.

2. The power supply of claim 1, wherein, for operation as the SMAL regulator in ET mode, the envelope tracking bandwidth is substantially equal to the power bandwidth of the load.

3. The power supply of claim 1, wherein, for operation as the SMPS in AT mode, the adaptive tracking bandwidth corresponds to the average peak power of the power bandwidth.

4. The power supply of claim 1, wherein, for operation as the SMAL regulator in ET mode, the switcher circuit is operable to maximize switcher current at the switcher bandwidth, thereby minimizing amplifier current required to be supplied by the amplifier circuit.

5. The power supply of claim 1, wherein the switcher circuit is a buck converter with a buck inductor coupled to the supply node.

6. The power supply of claim 1, wherein the first and second transistor mode switches are field effect transistors.

7. A system, comprising:
a power amplifier coupled to receive a dynamic input signal with a signal bandwidth, to output an amplified signal with a power bandwidth corresponding to the input signal bandwidth, the power amplifier including a supply input;
a power supply selectively operable in two tracking modes during respective frames, with tracking bandwidths related to the load power bandwidth, and including
an amplifier circuit and a switched mode converter (switcher) circuit coupled in parallel at a supply node coupled to the load; and
an output capacitor coupled to the supply node;
the power supply selectively operable in:
an envelope tracking (ET) mode during ET frames in which the amplifier circuit and the switcher circuit are operable as a switch mode assisted linear (SMAL) regulator, with the amplifier circuit switch-coupled to the supply node, and operable to set the regulated load voltage with an envelope tracking bandwidth, and to supply load current not supplied by the switcher circuit, and with the switcher circuit operable as a controlled current source supplying switcher current at a switcher bandwidth less than the envelope tracking bandwidth; and
an adaptive tracking (AT) mode during AT frames in which the amplifier circuit is switch-decoupled from the supply node, and the switcher circuit and the output capacitor are operable as a switched mode power supply (SMPS) operable to set the regulated load voltage, and to supply the load current, with an adaptive tracking bandwidth that is less than the envelope tracking bandwidth;
the power supply further including staged switch array circuitry, including:
a first transistor mode switch coupled between a bottom plate of the output capacitor and ground;
a second transistor mode switch coupled between the amplifier circuit and the supply node;
the staged switch array circuitry to control transitions between the tracking modes using staged switching to effect two transition modes, during which the amplifier circuit is operated in constant voltage envelope tracking (CVET) mode such that the load voltage at the supply node is held at a substantially constant CVET voltage:
an ET-AT transition mode initiated at an AT frame boundary by controlling the first transistor mode switch to switch-couple the bottom plate of the output capacitor to ground, and operating the amplifier circuit in CVET mode to hold the supply node at a CVET voltage corresponding to a target AT voltage, enabling the output capacitor to precharge to the target AT voltage, and then controlling the second transistor mode switch to decouple the amplifier circuit from the supply node, thereby transitioning for operation as the SMPS in AT tracking mode; and an AT-ET transition mode initiated prior to an ET frame boundary by first controlling the second transistor mode switch to switch-couple the amplifier circuit to the supply node, and operating the amplifier circuit in CVET mode to hold the supply node at a CVET voltage corresponding to an APT voltage on the output capacitor, and then controlling the second transistor mode switch to decouple the bottom plate of the output capacitor from ground, enabling the output capacitor to discharge, thereby transitioning for operation as the SMAL regulator in ET tracking mode.

8. The system of claim 7, wherein, for operation as the SMAL regulator in ET mode, the envelope tracking bandwidth is substantially equal to the power bandwidth of the load.

9. The system of claim 7, wherein, for operation as the SMPS in AT mode, the adaptive tracking mode tracks average peak power.

10. The system of claim 7 wherein, for operation as the SMAL regulator, the switcher circuit is operable to maximize switcher current at the switcher bandwidth, thereby minimizing amplifier current required to be supplied by the amplifier circuit.

11. The system of claim 1, wherein the switcher, circuit is a buck converter with a buck inductor.

12. The system of claim 7, wherein the first and second transistor mode switches are field effect transistors.

13. The system of claim 7, wherein the power amplifier is an RF transmit power amplifier, and the dynamic input signal is an RF signal with an RF bandwidth, and the power amplifier outputs an amplified RF signal with an RF power bandwidth.

14. A method for supplying a regulated load voltage and associated load current to a dynamic load characterized by a power bandwidth, the method operable in two tracking modes with tracking bandwidths related to the load power bandwidth, the method operable with power supply that includes an amplifier circuit and a switched mode converter (switcher) circuit coupled in parallel at a supply node coupled to the load, and an output capacitor coupled to the supply node, comprising selectively operating the power supply in two tracking modes during respective frames:
an envelope tracking (ET) mode during an ET frame in which the amplifier circuit and the switcher circuit are operable as a switch mode assisted linear (SMAL) regulator, with the amplifier circuit switch-coupled to the supply node, and operable to set the regulated load voltage with an envelope tracking bandwidth, and to supply load current not supplied by the switcher circuit, and with the switcher circuit operable as a controlled current source supplying switcher current at a switcher bandwidth less than the envelope tracking bandwidth; and
an adaptive tracking (AT) mode during an AT frame in which the amplifier circuit is switch-decoupled from the supply node, and the switcher circuit and the output capacitor are operable as a switched mode power supply (SMPS) operable to set the regulated load voltage, and supply the load current, with an adaptive tracking bandwidth that is less than the envelope tracking bandwidth;

wherein selectively operating the power supply in two tracking modes is accomplished by controlling transitions between the tracking modes using staged switching to effect two transition modes, during which the amplifier circuit is operated in constant voltage envelope tracking (CVET) mode such that the load voltage at the supply node is held at a substantially constant CVET voltage:
an ET-AT transition mode initiated at an AT frame boundary by
switch-coupling the bottom plate of the output capacitor to ground,
operating the amplifier circuit in CVET mode to hold the supply node at a CVET voltage corresponding to a target AT voltage, and
pre-charging the output capacitor to the target AT voltage, and then
switch-decoupling the amplifier circuit from the supply node,
thereby transitioning for operation as the SMPS in AT tracking mode; and
an AT-ET transition mode initiated prior to an ET frame boundary by
switch-coupling the linear amplifier to the supply node,
operating the amplifier circuit in CVET mode to hold the supply node at a CVET voltage corresponding to an APT voltage on the output capacitor, and then
switch-decoupling the bottom plate of the output capacitor from ground, and
discharging the output capacitor,
thereby transitioning for operation as the SMAL regulator in ET tracking mode.

15. The method of claim 14, wherein selectively operating the power supply by controlling transitions between the tracking modes using staged switching is accomplished with staged switch array circuit, including: a first transistor mode switch coupled between a bottom plate of the output capacitor and ground, and a second transistor mode switch coupled between the amplifier circuit and the supply node.

16. The method of claim 14, wherein, when operating as the SMAL regulator in ET mode, the envelope tracking bandwidth is substantially equal to the power bandwidth of the load.

17. The method of claim 14, wherein, when operating as the SMPS in AT mode, the adaptive tracking mode tracks average peak power.

18. The method of claim 14 wherein, when operating as the SMAL regulator, the switcher circuit is operable to maximize switcher current at the switcher bandwidth, thereby minimizing amplifier current required to be supplied by the amplifier circuit.

19. The method of claim 14, wherein the switcher circuit is a buck converter with a buck inductor.

20. The method of claim 14, wherein the dynamic load is an RF transmit power amplifier operable to amplify a dynamic RF signal with an RF bandwidth, and the power amplifier outputs an amplified RF signal with an RF power bandwidth.

* * * * *